(12) United States Patent
Lin et al.

(10) Patent No.: US 10,964,815 B2
(45) Date of Patent: Mar. 30, 2021

(54) CMOS FINFET WITH DOPED SPACERS AND METHOD FOR FORMING THE SAME

(71) Applicant: TAIWAN SEMICONDUCTOR MANUFACTURING COMPANY LTD., Hsinchu (TW)

(72) Inventors: Hong-Nien Lin, Hsinchu (TW); Ming-Heng Tsai, Taipei (TW); Yong-Yan Lu, Hsinchu (TW); Chun-Sheng Liang, Changhua County (TW); Jeng-Ya Yeh, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 37 days.

(21) Appl. No.: 16/006,823

(22) Filed: Jun. 12, 2018

(65) Prior Publication Data

US 2019/0378927 A1    Dec. 12, 2019

(51) Int. Cl.
*H01L 29/66* (2006.01)
*H01L 21/3115* (2006.01)
*H01L 29/78* (2006.01)
*H01L 23/31* (2006.01)
*H01L 23/29* (2006.01)
*H01L 21/8238* (2006.01)
*H01L 27/092* (2006.01)

(52) U.S. Cl.
CPC .... *H01L 29/7843* (2013.01); *H01L 21/31155* (2013.01); *H01L 21/823821* (2013.01); *H01L 21/823864* (2013.01); *H01L 23/291* (2013.01); *H01L 23/3171* (2013.01); *H01L 27/0924* (2013.01); *H01L 29/6656* (2013.01); *H01L 29/66545* (2013.01); *H01L 29/66795* (2013.01)

(58) Field of Classification Search
CPC ............. H01L 29/6656; H01L 29/7843; H01L 21/823864; H01L 21/823821; H01L 21/31155
See application file for complete search history.

(56) References Cited

U.S. PATENT DOCUMENTS

| | | | |
|---|---|---|---|
| 6,333,247 B1 * | 12/2001 | Chan | H01L 21/28518 257/E21.165 |
| 6,690,084 B1 * | 2/2004 | Mizuhara | H01L 21/31116 257/650 |
| 6,924,186 B2 * | 8/2005 | Sandhu | H01L 21/02145 438/216 |
| 2002/0137297 A1 * | 9/2002 | Kunikiyo | H01L 21/28035 438/305 |
| 2003/0011009 A1 * | 1/2003 | Zhang | H01L 21/823437 257/284 |

(Continued)

*Primary Examiner* — Allen L Parker
*Assistant Examiner* — Gustavo G Ramallo
(74) *Attorney, Agent, or Firm* — WPAT, P.C., Intellectual Property Attorneys; Anthony King

(57) ABSTRACT

A semiconductor device includes a substrate, a gate disposed over the substrate, a source/drain disposed in the substrate at two sides of the gate, and an insulating layer disposed over sidewalls of the gate and at least a portion of a surface of the source/drain. In some embodiments, the insulating layer includes a first side facing the gate or the source, and includes a second side opposite to the first side. The insulating layer includes dopants, and a concentration of the dopants is reduced from the second side to the first side of the insulating layer.

15 Claims, 28 Drawing Sheets

(56) References Cited

U.S. PATENT DOCUMENTS

| | | | |
|---|---|---|---|
| 2003/0094613 A1* | 5/2003 | Joo | H01L 29/66757 257/59 |
| 2003/0098486 A1* | 5/2003 | Sambonsugi | H01L 21/28035 257/371 |
| 2004/0043595 A1* | 3/2004 | Lee | H01L 21/76889 438/592 |
| 2004/0113217 A1* | 6/2004 | Chidambarrao | H01L 21/823807 257/415 |
| 2004/0157397 A1* | 8/2004 | Quek | H01L 29/6653 438/305 |
| 2005/0048752 A1* | 3/2005 | Doris | H01L 21/84 438/595 |
| 2006/0019456 A1* | 1/2006 | Bu | H01L 29/6653 438/303 |
| 2008/0067557 A1* | 3/2008 | Yu | H01L 29/045 257/255 |
| 2008/0268602 A1* | 10/2008 | Cheng | H01L 29/6653 438/305 |
| 2009/0032841 A1* | 2/2009 | Eller | H01L 21/823807 257/190 |
| 2011/0031538 A1* | 2/2011 | Hsieh | H01L 29/6656 257/288 |
| 2012/0032238 A1* | 2/2012 | Teo | H01L 21/28518 257/288 |

* cited by examiner

CMOS FINFET WITH DOPED SPACERS AND METHOD FOR FORMING THE SAME

BACKGROUND

The semiconductor integrated circuit (IC) industry has experienced rapid growth. Technological advances in IC materials and design have produced generations of ICs in which each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the size of the smallest component (or line) that can be created using a fabrication process) has decreased. This scaling-down trend generally provides benefits by increasing production efficiency and decreasing associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

One process of forming a metal gate stack is termed a "gate last" process in which the final gate stack is fabricated last, which allows for a reduced number of subsequent processes, including high temperature processing, that must be performed after formation of the gate. The gate last process including forming a metal gate in a trench left by removal of a dummy gate. Additionally, as the dimensions of transistors decrease, the thickness of the gate oxide must be reduced to maintain performance with the decreased gate length. In order to reduce gate leakage, high-k gate insulator layers are used which allow greater physical thicknesses while maintaining the same effective thickness as that provided by a typical gate oxide used in larger technology nodes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
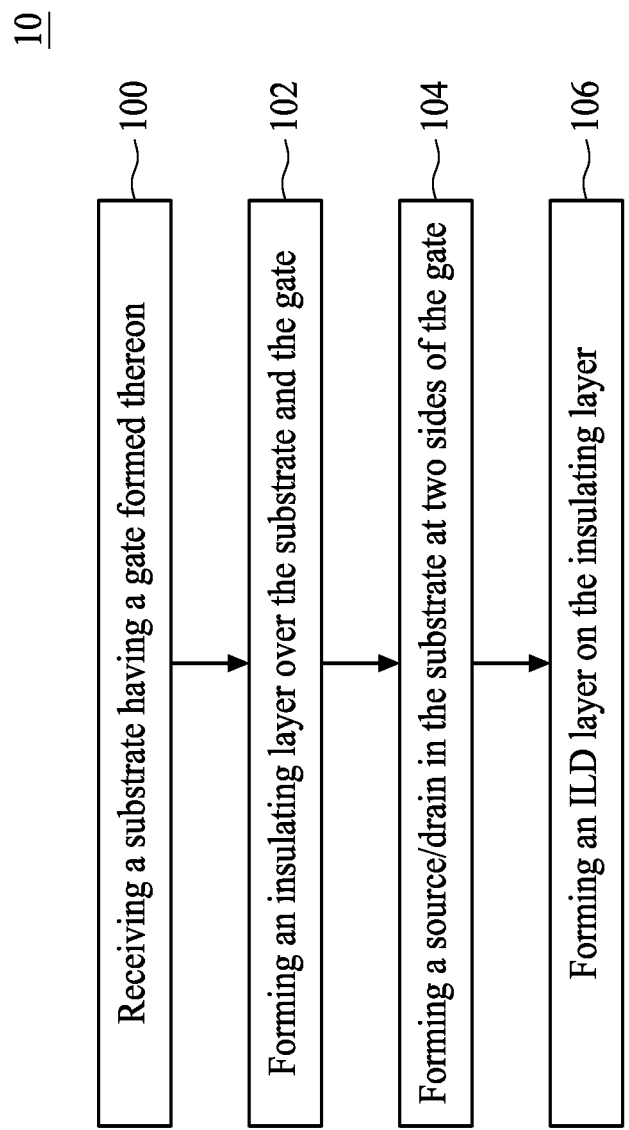
FIG. 1 is a flowchart representing a method for forming a semiconductor device according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In some embodiments, a semiconductor device including a metal gate (including a metal gate electrode and a high-k gate dielectric layer) is formed over a substrate or along sidewalls of a fin structure, which is used to increase surface area of the channel and source/drain regions to produce faster, more reliable and better-controlled semiconductor transistor devices. One approach for forming the metal gate electrode is termed a "gate last" or "replacement gate" approach. In some embodiments, a dummy gate, such as a dummy polysilicon gate, is formed, various operations associated with the semiconductor device are performed, and the dummy gate is subsequently removed and replaced with the metal gate.

During the various operations performed for the semiconductor device, a screening layer, usually a silicon oxide (SiO) screening layer, is formed prior to ion implantation for forming the source/drain region. The screening layer is deposited to mitigate damage to the substrate during the ion implantation and to reduce out-diffusion of dopants (or so-called dopant outgassing) during subsequent thermal anneals. Consequently, current leakage can be reduced by the screening layer. The screening layer is then removed, forming a better quality silicon nitride (SiN) layer, which serves as a contact etch stop layer (CESL). However, it is found that during the removal of the screening layer, damage may be caused to the substrate, reducing the quality of the semiconductor device.

The present disclosure therefore provides a semiconductor device having a screening layer formed of a SiN-based layer. The screening layer is not removed, but is left on the substrate to serve as a CESL. The SiN-based screening layer provides better sealing ability and thus damage to the substrate during the ion implantation, and dopant outgassing during thermal annealing, are both reduced. Further, since the SiN-based screening layer is not removed, damage to the substrate due to the removal is prevented, and thus performance of the semiconductor device is improved.

FIG. 1 is a flowchart of a method 10 for forming a semiconductor device. The method 10 includes an operation 100, receiving a substrate having a gate formed thereon. The method 10 further includes an operation 102, forming an insulating layer over the substrate and the gate. The method 10 further includes an operation 104, forming a source/drain in the substrate at two sides of the gate. The method 10 further includes an operation 106, forming an interlayer dielectric (ILD) layer on the insulating layer. The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

Figure 2:
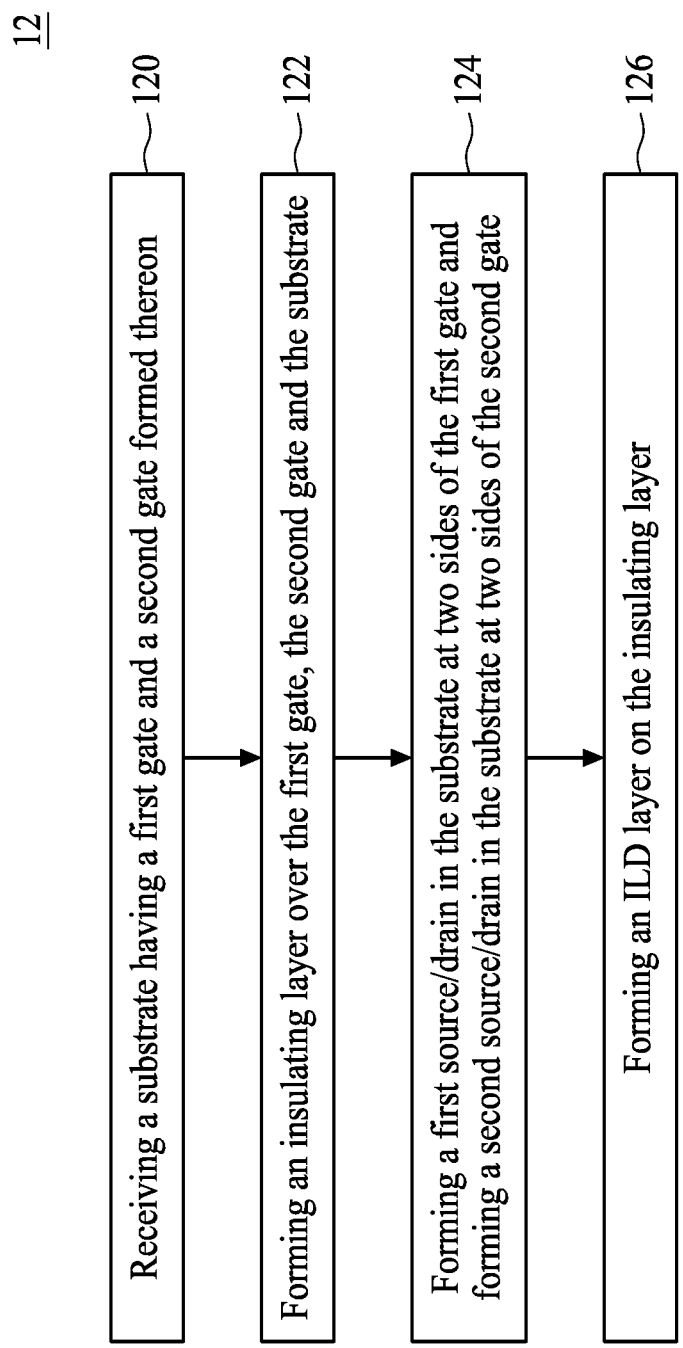
FIG. 2 is a flowchart representing a method for forming a semiconductor device according to aspects of the present disclosure.

FIG. 2 is a flowchart of a method 12 for forming a complementary metal-oxide-semiconductor (CMOS) device. The method 12 includes an operation 120, receiving a substrate having a first gate and a second gate formed thereon. The method 12 further includes an operation 122, forming an insulating layer over the first gate, the second gate and the substrate. The method 12 further includes an operation 124, forming a first source/drain in the substrate at two sides of the first gate, and forming a second source/drain in the substrate at two sides of the second gate. The method 12 further includes an operation 126, forming an ILD layer on the insulating layer. The method 12 will be further described according to one or more embodiments. It should be noted that the operations of the method 12 may be rearranged or otherwise modified within the scope of the various aspects. It should be further noted that additional processes may be provided before, during, and after the method 12, and that some other processes may be only briefly described herein. Thus, other implementations are possible within the scope of the various aspects described herein.

Figure 3:
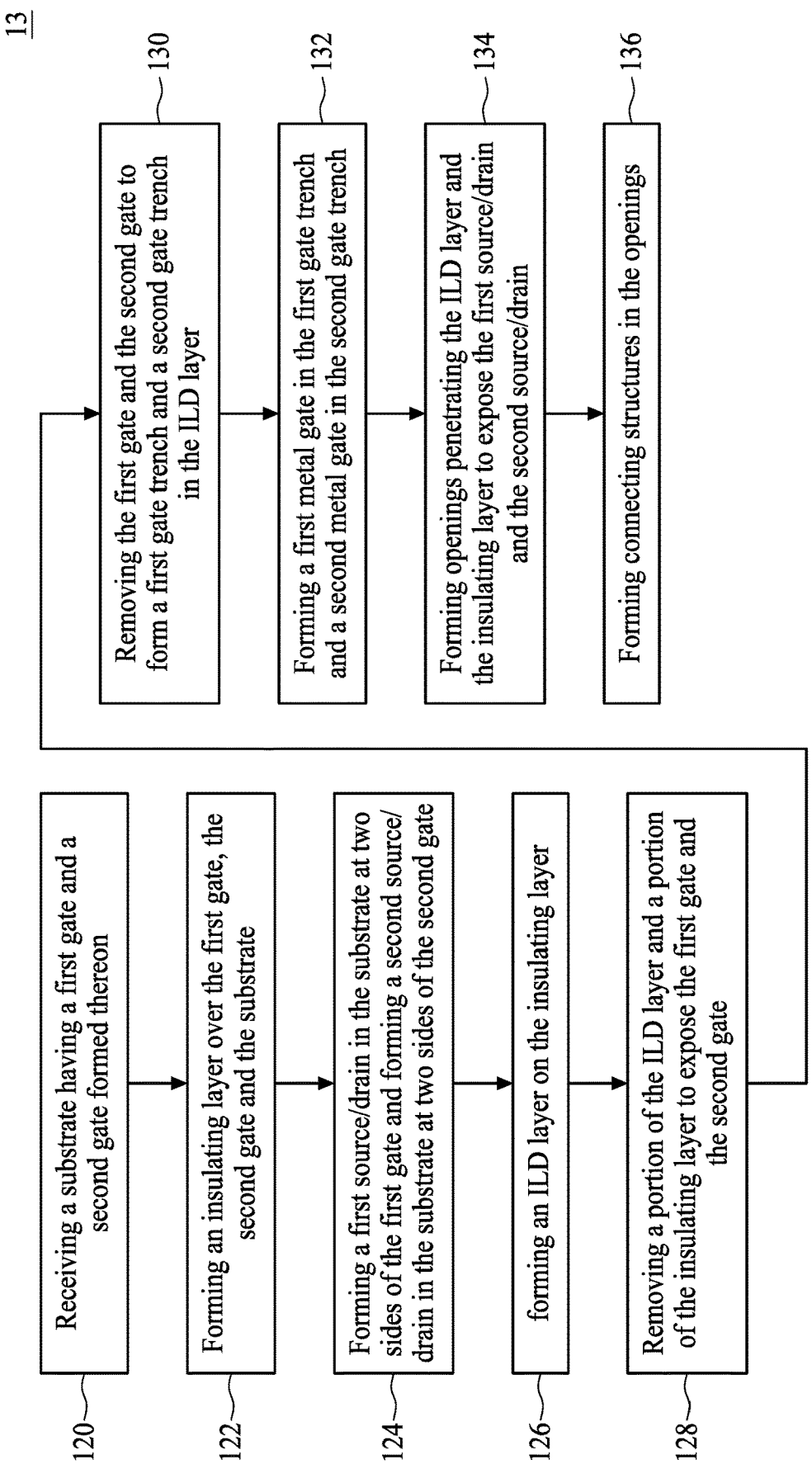
FIG. 3 is a flowchart representing a method for forming a semiconductor device according to aspects of the present disclosure.

FIG. 3 is a flowchart of a method 13 for forming a CMOS device. In some embodiments, the method 13 can be followed as to form a metal gate and a connecting structure after the method 12, but the disclosure is not limited thereto. The method 13 includes an operation 120, receiving a substrate having a first gate and a second gate formed thereon. The method 13 further includes an operation 122, forming an insulating layer over the first gate, the second gate and the substrate. The method 13 further includes an operation 124, forming a first source/drain in the substrate at two sides of the first gate, and forming a second source/drain in the substrate at two sides of the second gate. The method 13 further includes an operation 126, forming an ILD layer on the insulating layer. The method 13 further includes an operation 128, removing a portion of the ILD layer and a portion of the insulating layer to expose the first gate and the second gate. The method 13 further includes an operation 130, removing the first gate and the second gate to form a first gate trench and a second gate trench in the ILD layer. The method 13 further includes an operation 132, forming a first metal gate in the first gate trench and a second metal gate in the second gate trench. The method 13 further includes an operation 134, forming openings penetrating the ILD layer and the insulating layer to expose the first source/drain and the second source/drain. The method 13 further includes an operation 136, forming connecting structures in the openings. The method 13 will be further described according to one or more embodiments. It should be noted that the operations of the method 13 may be rearranged or otherwise modified within the scope of the various aspects. It should be further noted that additional processes may be provided before, during, and after the method 13, and that some other processes may be only briefly described herein. Thus, other implementations are possible within the scope of the various aspects described herein.

Figure 4A:
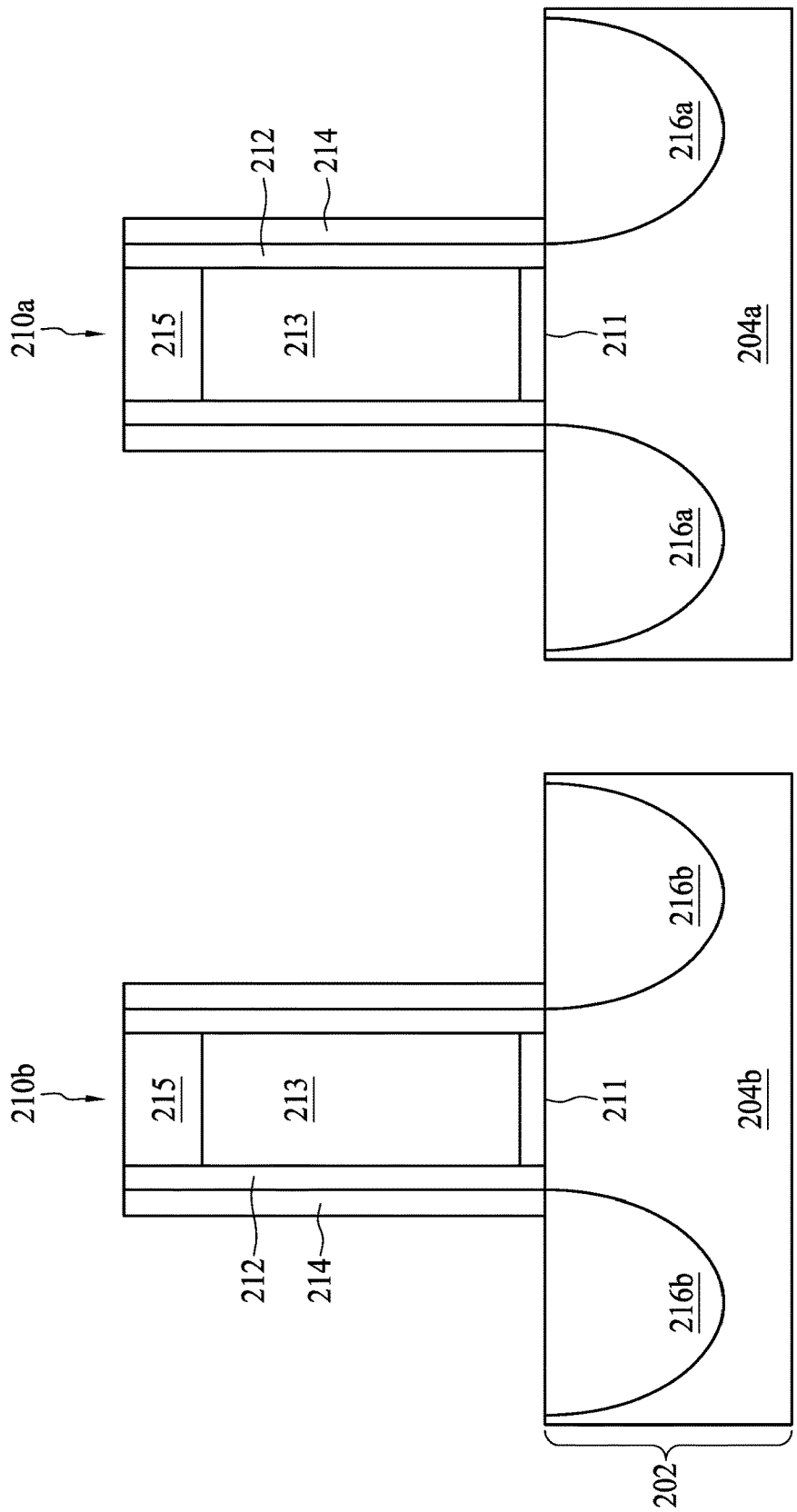
FIGS. 4A to 4K are schematic drawings illustrating a semiconductor device at various fabrication stages constructed according to aspects of the present disclosure in one or more embodiments.

FIGS. 4A to 4K are schematic drawings illustrating a CMOS device 200 at various fabrication stages constructed according to aspects of the present disclosure in one or more embodiments. As shown in FIG. 4A, a substrate 202 is received or provided. The substrate 202 can include silicon (Si), germanium (Ge), silicon germanium (SiGe), silicon carbide (SiC), a group III element, and a group IV element. The substrate 202 can include various doped regions such as n-wells, p-wells and isolation structures to provide electrical isolation between the various doped regions, though not shown. In some embodiments, the substrate 202 shown in FIG. 4A can include portions of fin structures, which are adopted in pursuit of higher device density, higher performance, and lower costs. Further, a first region 204a and a second region 204b are defined on the substrate 202. In some embodiments, the first region 204a is defined to accommodate a p-type field effect transistor (nFET) device, and the second region 204b is defined to accommodate an n-type field effect transistor (nFET) device, but the disclosure is not limited thereto.

Still referring to FIG. 4A, the substrate 202 includes two similar gates, a first gate 210a and a second gate 210b, respectively disposed in the first region 204a and the second region 204b, according to operation 100 of the method 10 or operation 120 of the methods 12 and 13. In some embodiments, the first gate 210a and the second gate 210b respectively include a SiO interfacial layer (IL). In some embodiments, a high-k dielectric layer can be further disposed over the interfacial layer. The interfacial layer and the high-k dielectric layer are generally designated by the reference number 211. The first gate 210a and the second gate 210b further include a polysilicon layer 213 formed over the interfacial layer or the high-k dielectric layer 211. In some embodiments, the polysilicon layer 213 is non-doped. In some embodiments, the polysilicon layer 213 alternatively or additionally includes amorphous silicon. A hard mask 215 is formed over the polysilicon layer 213. It should be understood that the formation of such layers, including patterning, is well known in the art, and will not be further discussed in the interest of brevity. Notably, the first gate 210a and the second gate 210b are referred to as dummy gates in some embodiments.

Still referring to FIG. 4A, a first spacer 212 and a second spacer 214 are then formed over sidewalls of the first gate 210a and the second gate 210b. In some embodiments, a thickness of each of the first spacer 212 and the second spacer 214 may be between approximately 3 nm and 6 nm, but the disclosure is not limited thereto. In some embodiments, the number of the spacers is not limited to two. A third spacer or more spacers can be formed over the sidewalls of the first gate 210a and the second gate 210b, if required. As shown in FIG. 4A, the first spacer 212 and the second spacer 214 are disposed adjacent to both major vertical sidewalls of the first gate 210a and the second gate 210b. The first spacer 212 and the second spacer 214 can include SiN, SiO, silicon oxynitride (SiON), silicon carbo nitride (SiCN), silicon oxycarbo nitride (SiOCN), and/or other suitable dielectric material. In some embodiments, the nitrogen concentration in the first spacer 212 and the second spacer 214 is less than 20%, such that the first spacer 212 and the second spacer 214 serve as nitride-light spacers, but the disclosure is not limited thereto. Additionally, in some embodiments, the first spacer 212 and the second spacer 214 can include different materials.

Still referring to FIG. 4A, in some embodiments, portions of the substrate 202 in the first region 204a are etched to form one or more recesses (not shown) at two sides of the first gate 210a, and a first strained material 216a may be selectively grown in the recess. Similarly, portions of the substrate 202 in the second region 204b are etched to form one or more recesses (not shown) at two sides of the second gate 210b, and a second strained material 216b may be selectively grown in the recesses. In some embodiments, the first strained material 216a, such as SiGe, is epi-grown for providing a compressive stress to the pFET device. In some embodiments, the second strained material 216b, such as silicon carbide (SiC) or silicon phosphide (SiP), is epi-grown for providing a tensile stress to the nFET. Further, a distance between the first strained material 216a and the sidewall of the polysilicon layer 213 of the first gate 210a is defined by a sum of the thicknesses of the first spacer 212 and the second spacer 214. Similarly, a distance between the second strained material 216b and the sidewall of the polysilicon layer 213 of the second gate 210b is defined by the sum of the thicknesses of the first spacer 212 and the second spacer 214. Additionally, a top surface of the first strained material 216a may be higher than a top surface of the substrate 202 due to the greater lattice constant of Ge, though such difference in heights is not shown.

Figure 4B:
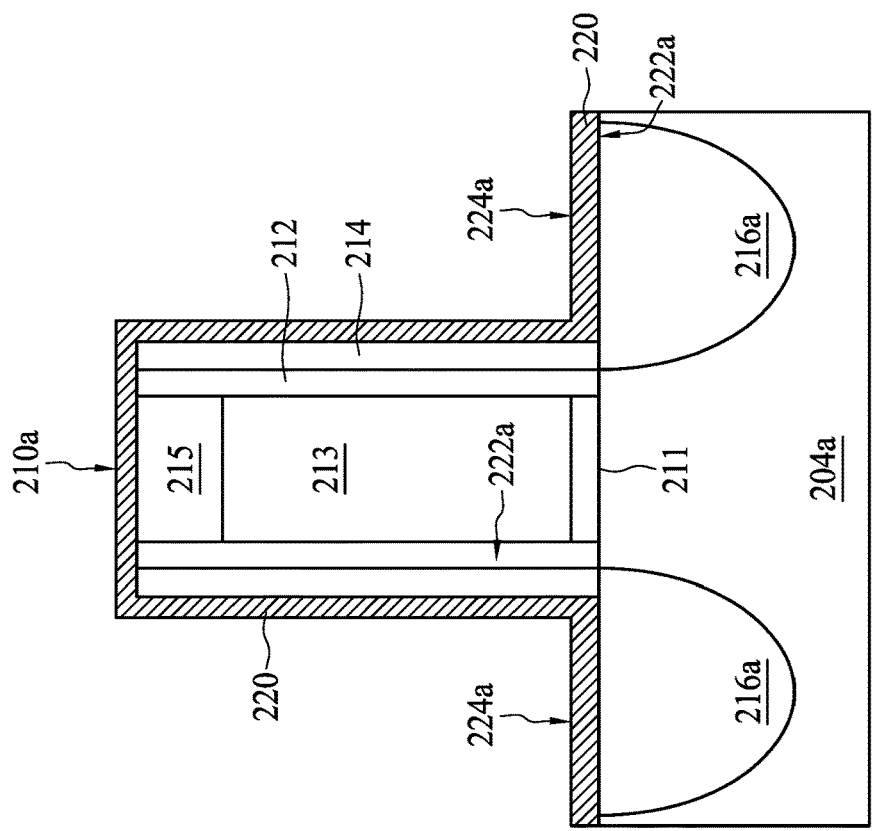
Figure 4B:
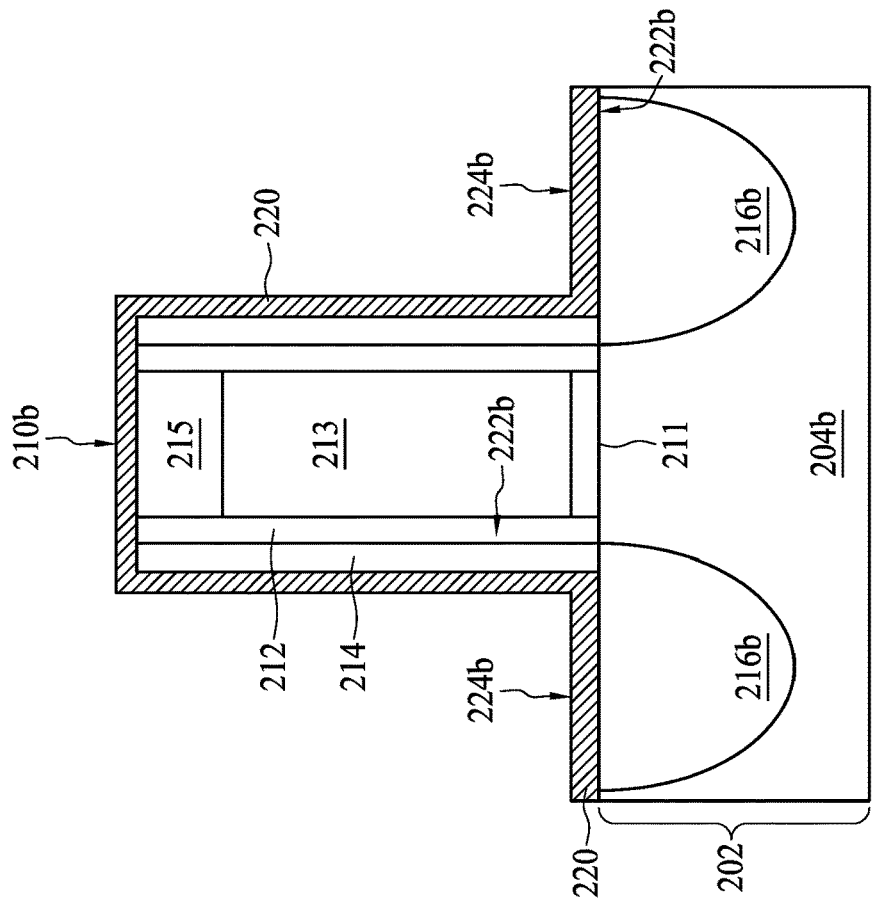

Referring to FIG. 4B, an insulating layer 220 is formed over the first gate 210a, the second gate 210b and the substrate 202, according to operation 102 of the method 10, or operation 122 of the methods 12 and 13. As shown in FIG. 4B, the insulating layer 220 is formed to cover a top surface of the substrate 202, the sidewalls and a top surface of the first gate 210a, and the sidewalls and a top surface of the second gate 210b. In the first region 204a, the insulating layer 220 has a first side 222a facing the first gate 210a, the substrate 202 or the first strained material 216a, and a second side 224a opposite to the first side 222a. In the second region 204b, the insulating layer 220 has a third side 222b facing the second gate 210b, the substrate 202 or the second strained material 216b, and a fourth side 224b opposite to the third side 222b. In some embodiments, a thickness of the insulating layer 220 is between approximately 2 nm and approximately 5 nm, but the disclosure is not limited thereto. In some embodiments, the insulating layer 220 is a single layer including SiN-based material, as shown in FIG. 4B. In some embodiments, the SiN-based insulating layer 220 can include $Si_3N_4$, SiCN, SiON, or SiOCN, but the disclosure is not limited thereto. In some embodiments, the insulating layer 220 and the second spacer 214 can include different materials.

Figure 5:
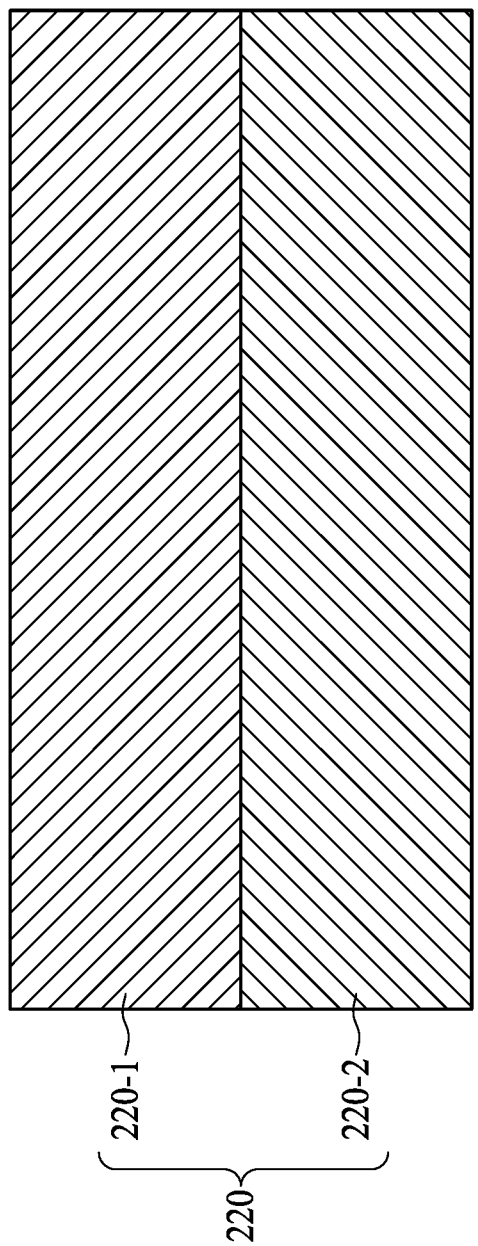
FIG. 5 is a schematic drawing illustrating a portion of the insulating layer according to aspects of the present disclosure in one or more embodiments.

In some embodiments, the insulating layer 220 is a multi-layer structure. For example, the insulating layer 220 can be a bi-layer structure, as shown in FIG. 5, which is an enlarged view of the insulating layer 220. In such embodiments, the bi-layer insulating layer 220 can include a SiN-based insulating layer 220-1 and a SiO-based insulating layer 220-2. Further, the SiO-based insulating layer 220-2 is sandwiched between the SiN-based insulating layer 220-1 and the gate 210a or 210b, between the SiN-based layer 220-1 and the substrate 202, and between the SiN-based layer 220-1 and the strained materials 216a/216b. In some embodiments, a thickness of the bi-layered insulating layer 220 is between approximately 2 nm and approximately 5 nm, and a ratio of a thickness of the SiN-based layer 220-1 to a thickness of the SiO-based layer 220-2 is approximately 1:1, but the disclosure is not limited thereto.

Figure 6:
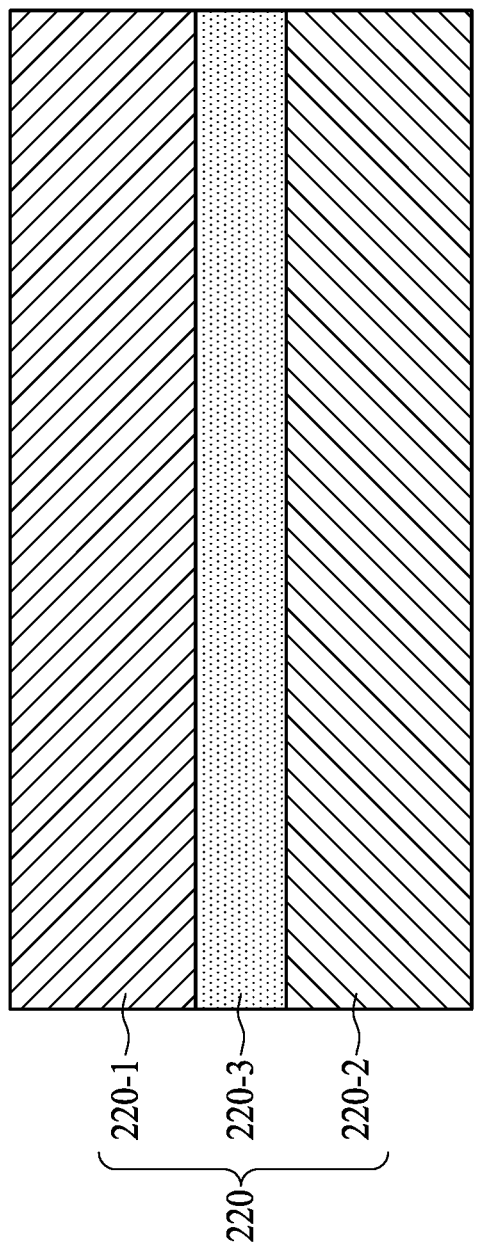
FIG. 6 is a schematic drawing illustrating a portion of the insulating layer according to aspects of the present disclosure in one or more embodiments.

In some embodiments, the insulating layer 220 is a tri-layer structure, as shown in FIG. 6, which is an enlarged view of the insulating layer 220. In such embodiments, the tri-layer insulating layer 220 can include a SiN-based insulating layer 220-1, a SiO-based insulating layer 220-2, and a carbon-doped (C-doped) SiN-based layer 220-3 sandwiched therebetween. As mentioned above, the SiO-based insulating layer 220-2 is sandwiched between the SiN-based insulating layer 220-1 and the gate 210a or 210b, between the SiN-based layer 220-1 and the substrate 202, and between the SiN-based layer 220-1 and the strained materials 216a/216b. In some embodiments, a thickness of the tri-layer insulating layer 220 is between approximately 2 nm and approximately 5 nm, and a ratio of a thickness of the SiN-based layer 220-1 to a thickness of the SiO-based layer 220-2 is approximately 1:1, but the disclosure is not limited thereto. In some embodiments, a thickness of the C-doped SiN-based layer 220-3 is less than the thicknesses of the SiN-based layer 220-1 and the SiO-based layer 220-2. Further, a carbon concentration of the C-doped SiN-based layer 220-3 is approximately 57%, but the disclosure is not limited thereto.

Figure 4C:
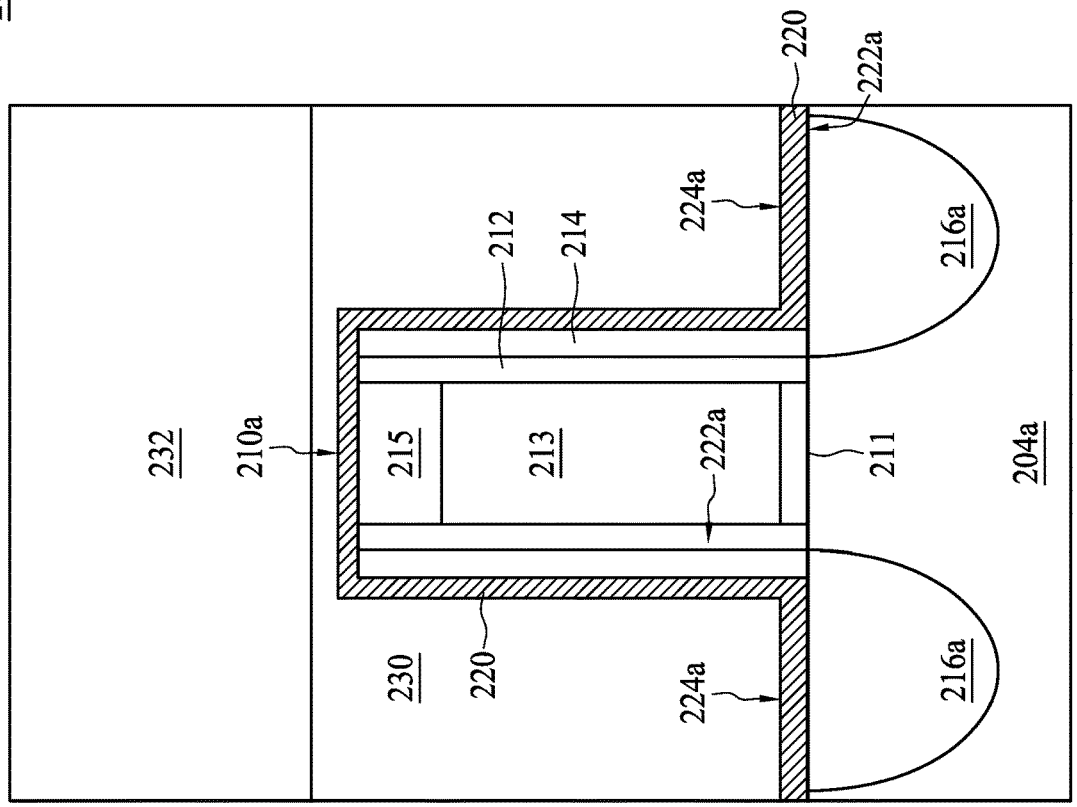

Referring to FIG. 4C, next, a protective layer including a bottom layer 230 and a photoresist 232 are formed over the substrate 202 and patterned. Accordingly, the patterned protective layer 230 and 232 covers and protects the elements in the first region 204a while the elements in the second region 204b are exposed. Subsequently, an ion implantation 234 is performed to implant dopants into the substrate 202 in the second region 204b. The second gate 210b serves as an implant mask, so that the dopants are implanted into areas where the second strained material 216b exists, at the two sides of the second gate 210b. Notably, the insulating layer 220 serves as a screening layer to mitigate damage to the substrate 202 during the ion implantation 234. Further, the dopants are implanted into the substrate 202 by penetrating the insulating layer 220, so that a portion of the insulating layer 220 receives the dopants during the ion implantation 234. In some embodiments, the dopants used in the ion implantation 234 include phosphorous (P), arsenic (Ar), indium (In) or antimony (Sb), but the disclosure is not limited thereto. It should be noted that the thickness of the insulating layer 220 should not be less than 2 nm, because at a thickness less than 2 nm the insulating layer 220 would not be thick enough to protect the surface of the substrate 202 during the ion implantation 234. After the ion implantation 234, the portion of the insulating layer 220 having the dopants is referred to as a second insulating layer 220b. Next, the patterned protective layer 230 and 232 is removed.

Figure 4D:
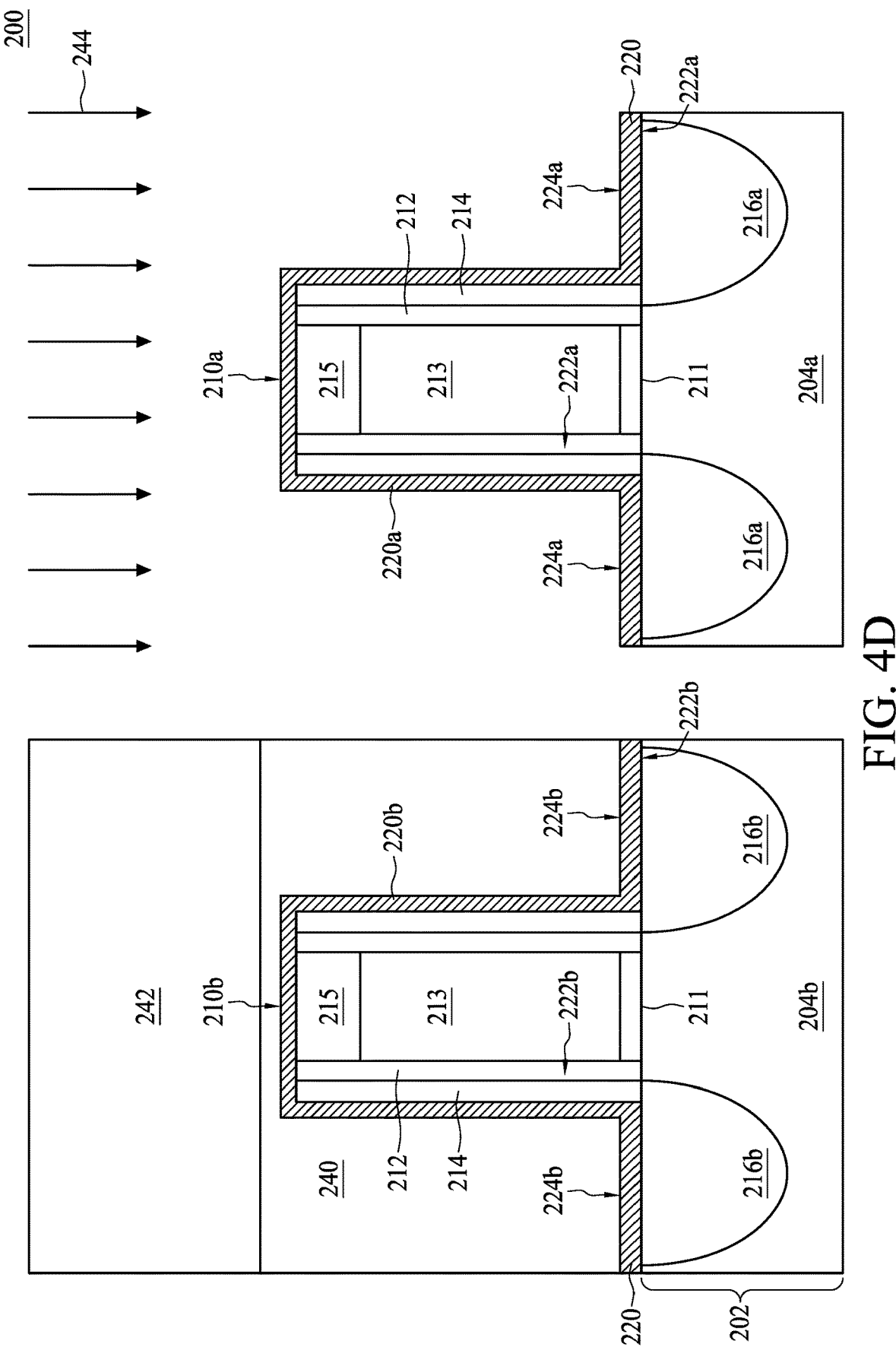

Referring to FIG. 4D, next, another protective layer including a bottom layer 240 and a photoresist 242 is formed over the substrate 202 and patterned. Accordingly, the patterned protective layer 240 and 242 covers and protects the elements in the second region 204b while the elements in the first region 204a are exposed. Subsequently, an ion implantation 244 is performed to implant dopants into the substrate 202 in the first region 204a. The first gate 210a serves as an implant mask, so that the dopants are implanted into areas where the first strained material 216a exists, at the two sides of the first gate 210a. Notably, the insulating layer 220 serves as a screening layer to mitigate damage to the substrate 202 during the ion implantation 244. Further, the dopants are implanted into the substrate 202 by penetrating the insulating layer 220, so that a portion of the insulating layer 220 receives the dopants during the ion implantation 244. In some embodiments, the dopants used in the ion implantation 244 include boron (B), gallium (Ga) or ytterbium (Yb), but the disclosure is not limited thereto. It should be noted that the thickness of the insulating layer 220 should not be less than 2 nm, because at a thickness less than 2 nm the insulating layer would not be thick enough to protect the surface of the substrate 202 during the ion implantation 244. After the ion implantation 244, the portion of the insulating layer 220 having the dopants is referred to as a first insulating layer 220a. Next, the patterned protective layer 240 and 242 is removed.

Figure 4E:
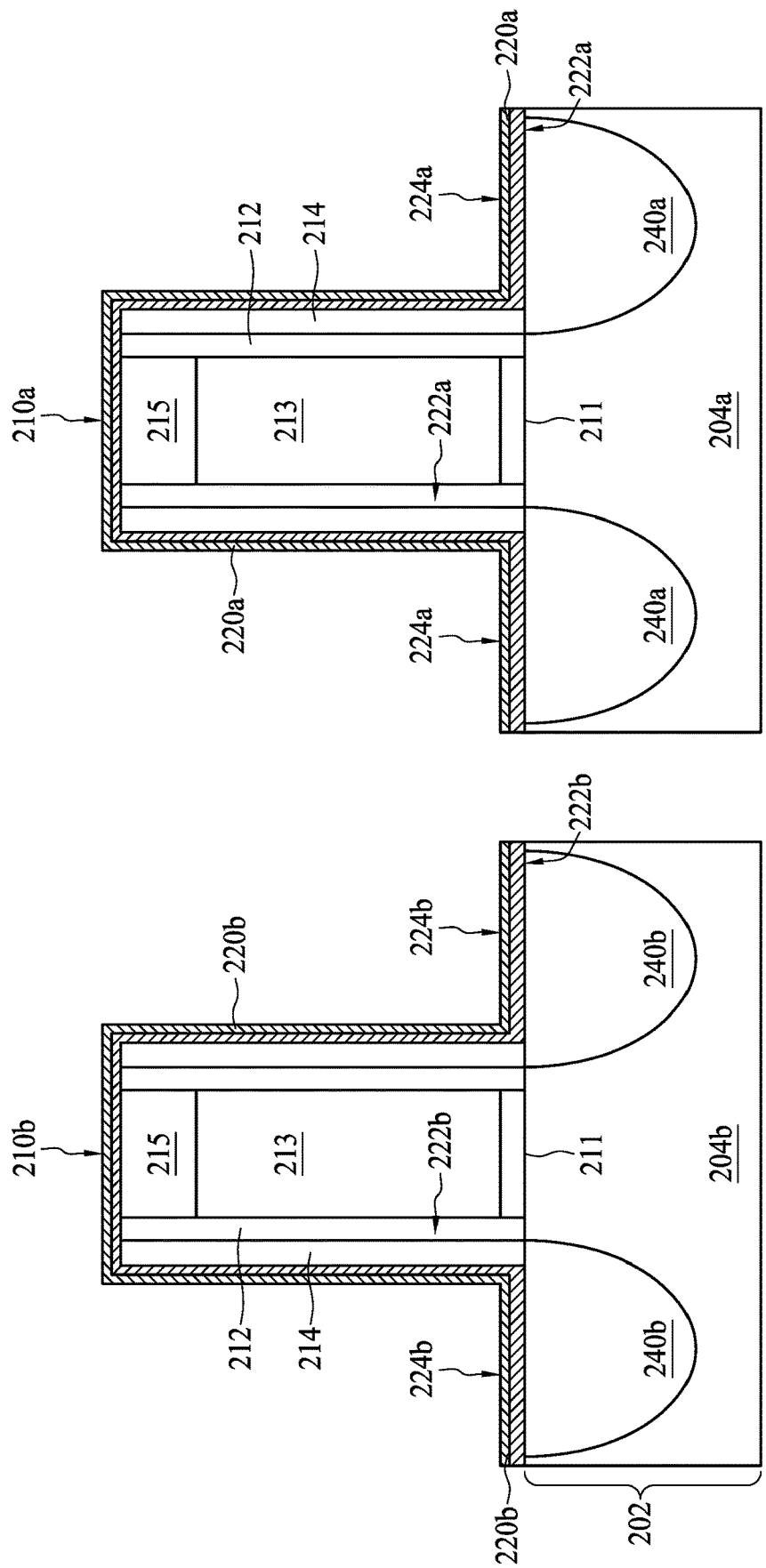

Referring to FIG. 4E, a source/drain is next formed in the substrate at two sides of each of the gates according to operation 104 of the method 10. In some embodiments, an anneal operation is performed to activate the dopants in the first strained material 216a and the dopants in the second strained material 216b, and thus a first source/drain 240a is formed in the substrate 202 at the two sides of the first gate 210a, and a second source/drain 240b is formed in the substrate 202 at the two sides of the second gate 210b, according to operation 124 of the method 12 and the method 13. Notably, the first insulating layer 220a and the second insulating layer 220b now serve as the screening layers to reduce dopant outgassing. In some embodiments, a concentration of the dopants in the first insulating layer 220a is reduced from the second side 224a to the first side 222a of the first insulating layer 220a, and a concentration of the dopants in the second insulating layer 220b is reduced from the fourth side 224b to the third side 222b of the second insulating layer 220b. For example, the concentration of boron in the first insulating layer 220a is reduced from approximately 3E10 to approximately 1E21, but the disclosure is not limited thereto. For example, the concentration of phosphorous in the second insulating layer 220b is reduced from approximately 3E10 to approximately 1E21, but the disclosure is not limited thereto.

Figure 4F:
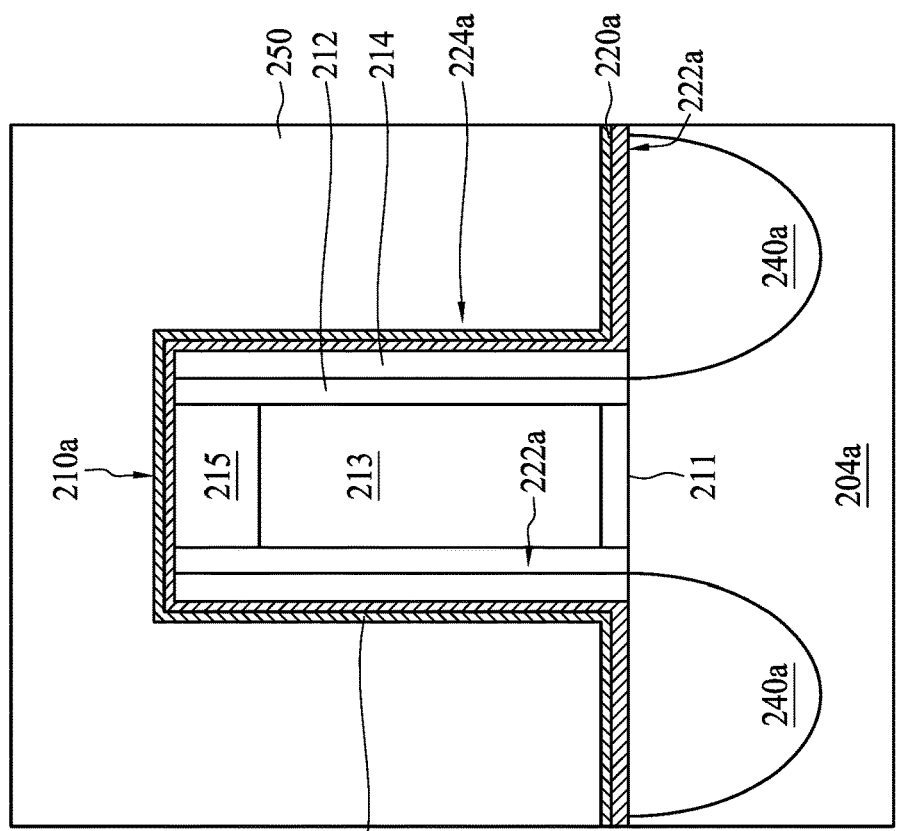
Figure 4F:
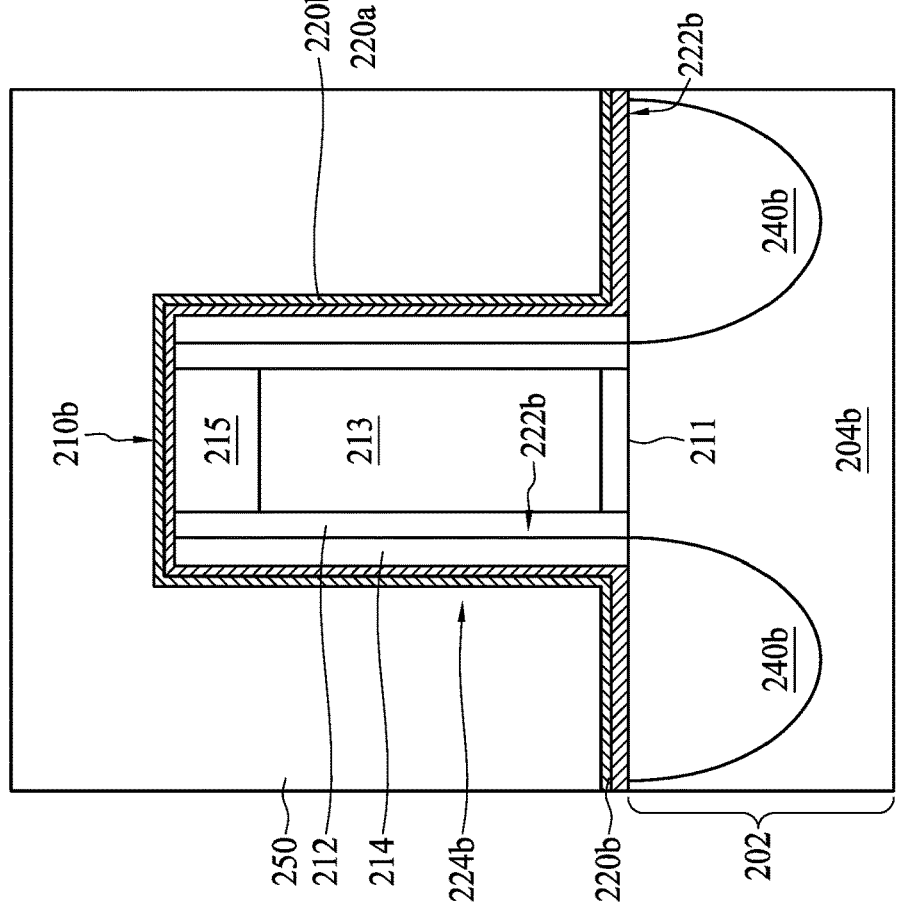

Referring to FIG. 4F, an ILD layer 250 is next formed on the insulating layer 220a and 220b according to operation 106 of the method 10 or operation 126 of the method 12 and the method 13. The ILD layer 250 can include one or more layers of insulating material such as SiO-based material, but the disclosure is not limited thereto. In some embodiments, the ILD layer 250 covers the substrate 202, and the first gate 210a and the second gate 210b are embedded within the ILD layer 250. It should be noted that the thickness of the insulating layer 220 (including the first insulating layer 220a and the second insulating layer 220b) should not be greater than 5 nm because at a thickness greater than 5 nm the insulating layer 220 is would be too thick to allow the ILD layer 250 to easily fill the space between the first and second gate 210a and 210b. In some embodiments, an unwanted void or seam may be formed in the ILD layer 250 if the thickness of the insulating layer 220 is greater than 5 nm, and such void or seam may degrade the electrical isolation provided by the ILD layer 250.

Figure 4G:
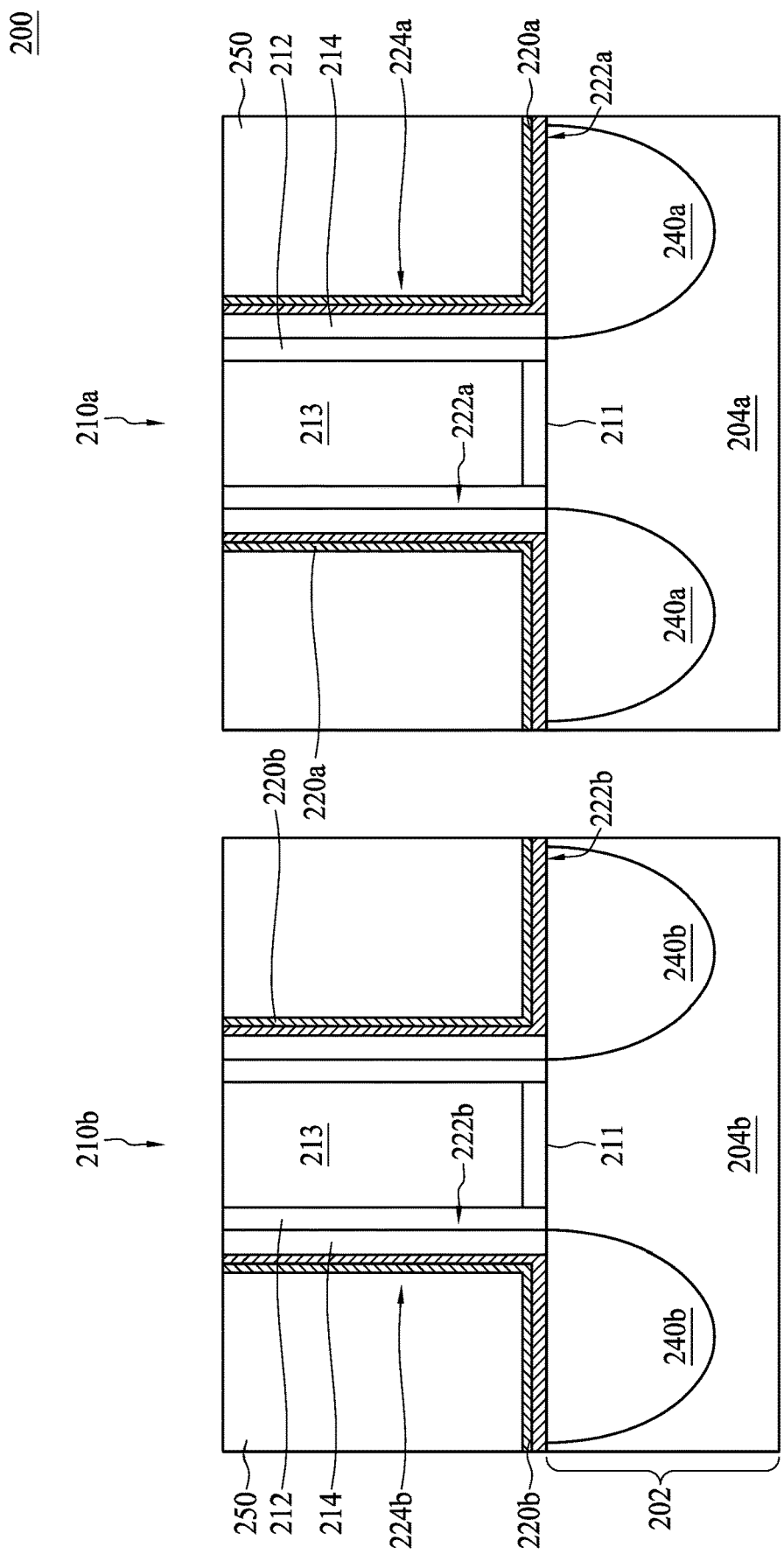

Referring to FIG. 4G, a portion of the ILD layer 250 and a portion of the insulating layer 220 are removed to expose the first gate 210a and the second gate 210b according to operation 128 of the method 13. In some embodiments, in addition to the removal of the portion of the ILD layer 250 and the removal of the portion of the insulating layer 220, the hard mask 215, a portion of the first spacer 212 and a portion of the second spacer 214 are also removed. Consequently, the polysilicon layers 213 of the first gate 210a and the second gate 210b are exposed, as shown in FIG. 4G. Therefore, the first insulating layer 220a covers the sidewalls of the first gate 210a, the first source/drain 240a and the substrate 202 in the first region 204a, while the second insulating layer 220b covers the sidewalls of the second gate 210b, the second source/drain 240b and the substrate 202 in the second region 204b after operation 128.

Figure 4H:
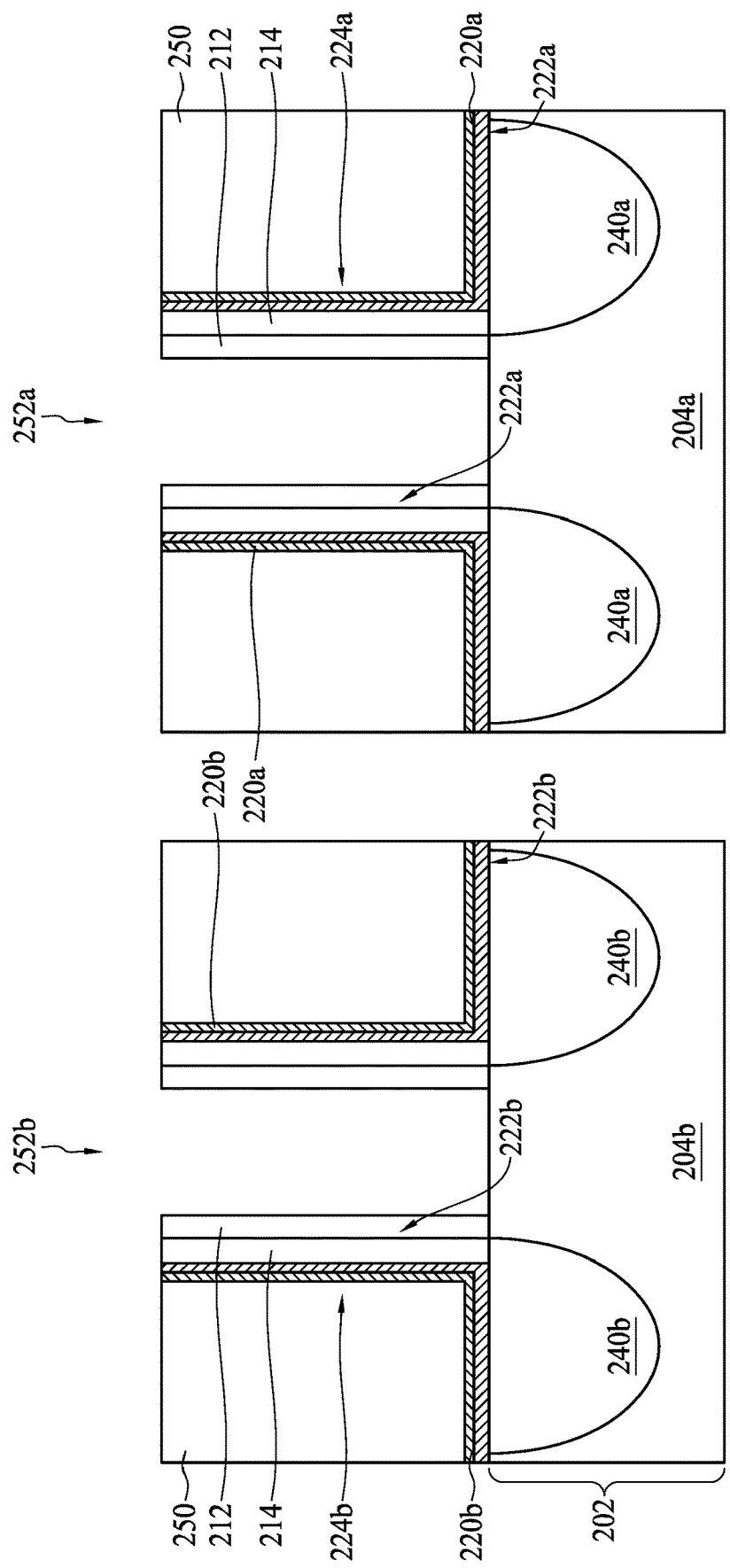

Referring to FIG. 4H, the polysilicon layer 213, the interfacial layer and the high-k dielectric layer 211 are removed, and thus a first gate trench 252a is formed in the ILD layer 250 in the first region 204a and a second gate trench 252b is formed in the ILD layer 250 in the second region 204b, according to operation 130 of the method 13. In some embodiments, the removal of the polysilicon layer 213 and the interfacial layer 211 forms the first and second gate trenches 252a and 252b between the portions of the first spacer 212, wherein a metal gate is to be formed within the first and second gate trenches 252a and 252b, as is typically performed in a replacement gate operation. In some embodiments, the first gate trench 250a and the second gate trench 250b are simultaneously formed, as shown in FIG. 4H. In other embodiments, the second gate trench 250b can be formed after the forming of the metal gate in the first gate trench 252a, which will be discussed below.

Figure 4I:
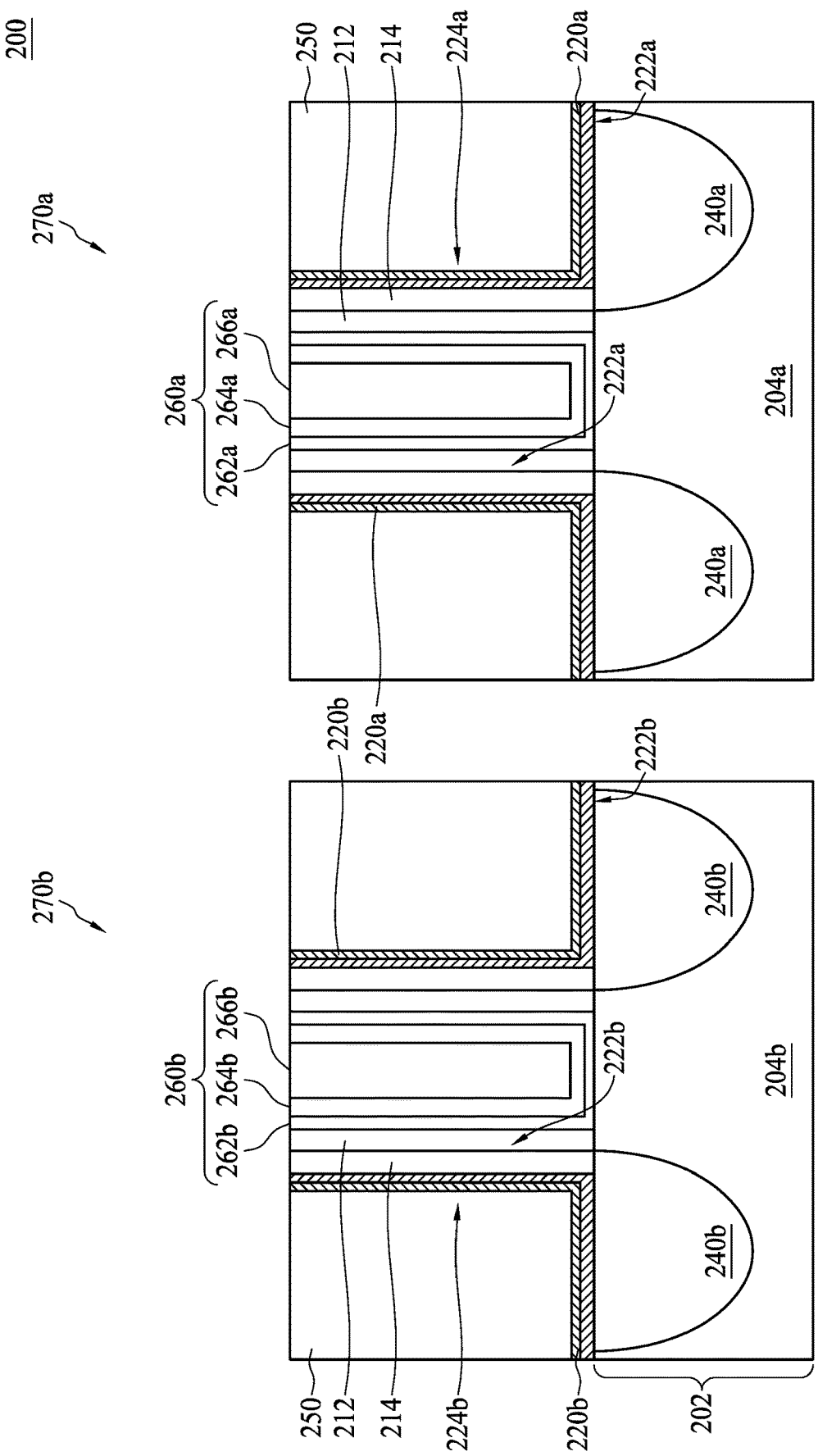

Referring to FIG. 4I, a first metal gate 260a is formed in the first gate trench 252a and a second metal gate 260b is formed in the second gate trench 252b, according to operation 132 of the method 13. In some embodiments, the first metal gate 260a includes at least a high-k dielectric layer 262a, a first work function metal layer 264a, and a gap-filling metal layer 266a, and the second metal gate 260b includes at least a high-k dielectric layer 262b, a second work function metal layer 264b, and a gap-filling metal layer 266b. In some embodiments, barrier layers or etch stop layers can be formed if required. In some embodiments, interfacial layers (not shown) can be further formed between the high-k dielectric layers 262a/262b and the substrate 202. In some embodiments, the high-k dielectric layers 262a and 262b may include one or more layers of metal oxides. The example of metal oxides used for the high-k dielectric layer 262a and 262b include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the first work function metal layer 264a can include one or more layers of conductive material for the pFET device. Examples of the first work function metal layer 264a include Ti, TiAlC, Al, TiAl, TaN, TaAlC, TiN, YiC and Co, but the disclosure is not limited thereto. In some embodiments, the second work function metal layer 264b can include one or more layers of conductive material for the nFET device. Examples of the second work function metal layer 264b include TiN TaN, TaAlC, TiC, TaC, Co, Al, TiAl, HfTi, TiSi, TaSi and TiAlC, but the disclosure is not limited thereto. The second work function metal layer 264b is made of a different material than the first work function metal layer 264a. The gap-filling metal layers 266a and 266b can include one or more layers of conductive material that have lower resistance and better gap-filling ability. Examples of the gap-filling metal layer 266a and 266b include Al, W and Cu, but the disclosure is not limited thereto. In some embodiments, a planarization operation can be performed after the forming of the gap-filling metal layers 266a and 266b, and thus superfluous metal layers are removed and a substantially even surface is obtained as shown in FIG. 4I.

Figure 4J:
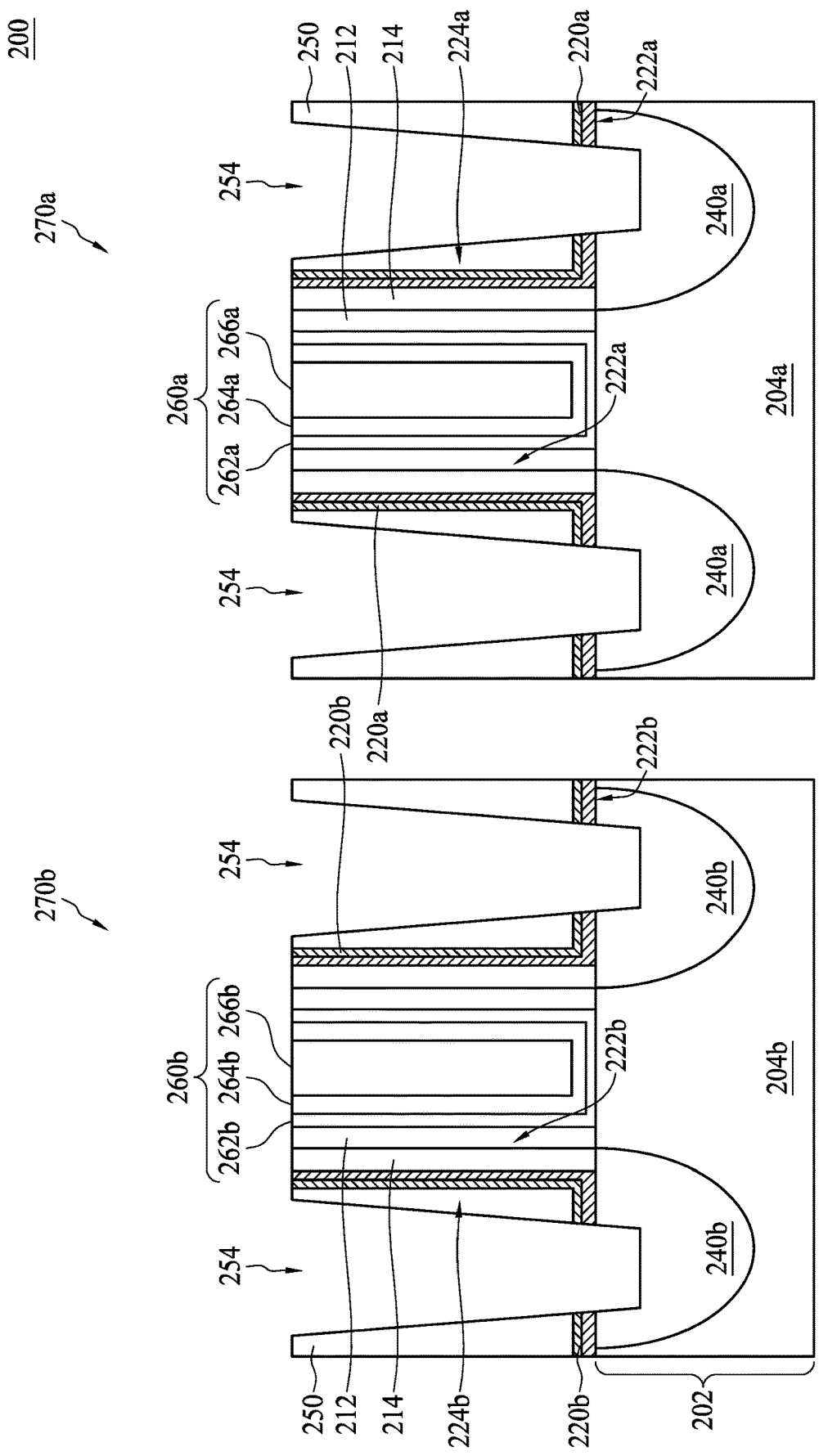

Referring to FIG. 4J, a plurality of openings 254 are formed in the ILD layer 250 according to operation 134 of the method 13. In some embodiments, the openings 254 penetrate the ILD layer 250, the first insulating layer 220a and the second insulating layer 220b. Accordingly, the first source/drain 240a and the second source/drain 240b are exposed through the openings 254, as shown in FIG. 4J. In some embodiments, the openings 254 are formed by etching the ILD layer 250. Further, the etching is stopped at the first insulating layer 220a and the second insulating layer 220b. Thus, the first insulating layer 220a and the second insulating layer 220b serve as a contact etch stop layer (CESL). Next, portions of the first insulating layer 220a and the second insulating layer 220b are removed and thus the first source/drain 240a and the second source/drain 240b are exposed. In some embodiments, a portion of the first source/drain 240a and a portion of the second source/drain 240b are further removed, and thus a bottom of the openings 254 can be formed to be lower than a top surface of the first source/drain 240a and a top surface of the second source/drain 240b, but the disclosure is not limited thereto.

Figure 4K:
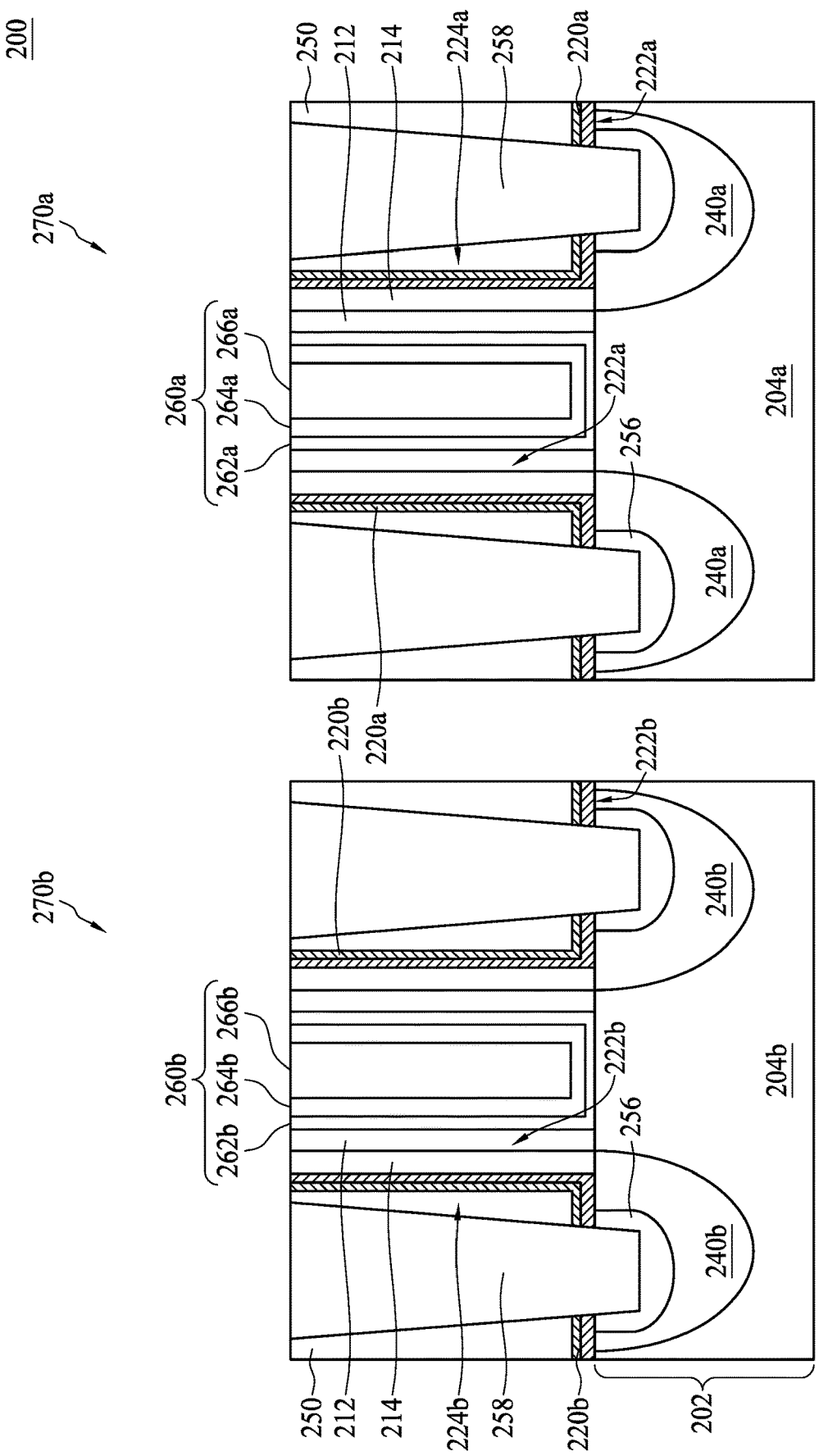

Referring to FIG. 4K, a connecting structure 258 is formed in each of the openings 254 according to operation 136 of the method 13. In some embodiments, metal silicide layers 256 can be formed before the forming of the connecting structures 258 for reducing contact resistance.

Accordingly, a CMOS device 200 is obtained. The CMOS device 200 can include a first FET device 270a such as a pFET device and a second FET device 270b such as an nFET device. In some embodiments, the first FET device 270a includes the substrate 202, the first metal gate 260a, the first source/drain 240a having the strained material in the substrate 202 at the two sides of the first metal gate 260a, the first spacer 212, the second spacer 214, and the first insulating layer 220a. As mentioned above, the first insulating layer 220a is disposed over the sidewalls of the first metal gate 260a and at least a portion of a surface of the first source/drain 240a. In some embodiments, the first spacer 212 is disposed between the first insulating layer 220a and the first metal gate 260a, and the second spacer 214 is disposed between the first spacer 212 and the first insulating layer 220a. The first insulating layer 220a includes the first side 222a facing the first metal gate 260a, the first source/drain 240a, or the substrate 202, and the first insulating layer 220a includes the second side 224a opposite to the first side 222a. The first source/drain 240a and the first insulating layer 220a include the first dopants, such as p-type dopants. Further, a first concentration of the first dopants is reduced from the second side 224a to the first side 222a of the first insulating layer 220a. For example, the concentration of the first dopants in the first insulating layer 220a is reduced from approximately 3E10 to approximately 1E 21, but the disclosure is not limited thereto. In some embodiments, the first insulating layer 220a can include a compressive stress.

In some embodiments, the second FET device 270b includes the substrate 202, the second metal gate 260b, the second source/drain 240b having the strained material in the substrate 202 at the two sides of the second metal gate 260b, the first spacer 212, the second spacer 214, and the second insulating layer 220b. As mentioned above, the second insulating layer 220b is disposed over the sidewalls of the second metal gate 260b and at least a portion of a surface of the second source/drain 240b. In some embodiments, the first spacer 212 is disposed between the second insulating layer 220b and the second metal gate 260b, and the second spacer 214 is disposed between the first spacer 212 and the second insulating layer 220b. The second insulating layer 220b includes the third side 222b facing the second metal gate 260b, the second source/drain 240b, or the substrate 202, and the second insulating layer 220b includes the fourth side 224b opposite to the third side 222b. The second source/drain 240b and the second insulating layer 220b include the second dopants, such as n-type dopants. Accordingly, the first dopants and the second dopants are complementary to each other. Further, a second concentration of the second dopants is reduced from the fourth side 224b to the third side 222b of the second insulating layer 220b. For example, the concentration of the second dopants in the second insulating layer 220b is reduced from approximately 3E10 to approximately 1E21, but the disclosure is not limited thereto. In some embodiments, the second insulating layer 220b can include a tensile stress.

Additionally, the first insulating layer 220a and the second insulating layer 220b can include a multi-layer structure. For example, the first insulating layer 220a and the second insulating layer 220b can be a single layer as shown in FIG.

4K, a bi-layer structure as shown in FIG. 5, or a tri-layer structure as shown in FIG. 6. The details of the bi-layer structure and the tri-layer structure are similar to those described above, therefore such details are omitted for brevity.

According to the semiconductor device 270a or 270b, and the CMOS device 200 including the devices 270a and 270b, the first insulating layer 220a and the second insulating layer 220b serve as the screening layer during the forming of the first and second source/drain 240a and 240b, and further serve as the CESL during the forming of the connecting structure 258. As a screening layer, the first insulating layer 220a and the second insulating layer 220b provide better protection for the substrate during the ion implantations 234 and 244, and the first insulating layer 220a and the second insulating layer 220b provide a better seal to reduce dopant outgassing during the anneal. As a CESL, the first insulating layer 220a and the second insulating layer 220b serve as the stop layer during the forming of the openings 254. Further, since the first insulating layer 220a and the second insulating layer 220b serve as both of the screening layer and the CESL, there is no longer a need to remove the screening layer after the forming of the source/drain, and no need to form the CESL after the removal of the screening layer. Consequently, damage to the substrate 202 caused by the removal is prevented, and operations for forming the semiconductor device 270a or 270b or the CMOS device 200 are thereby simplified.

Figure 7A:
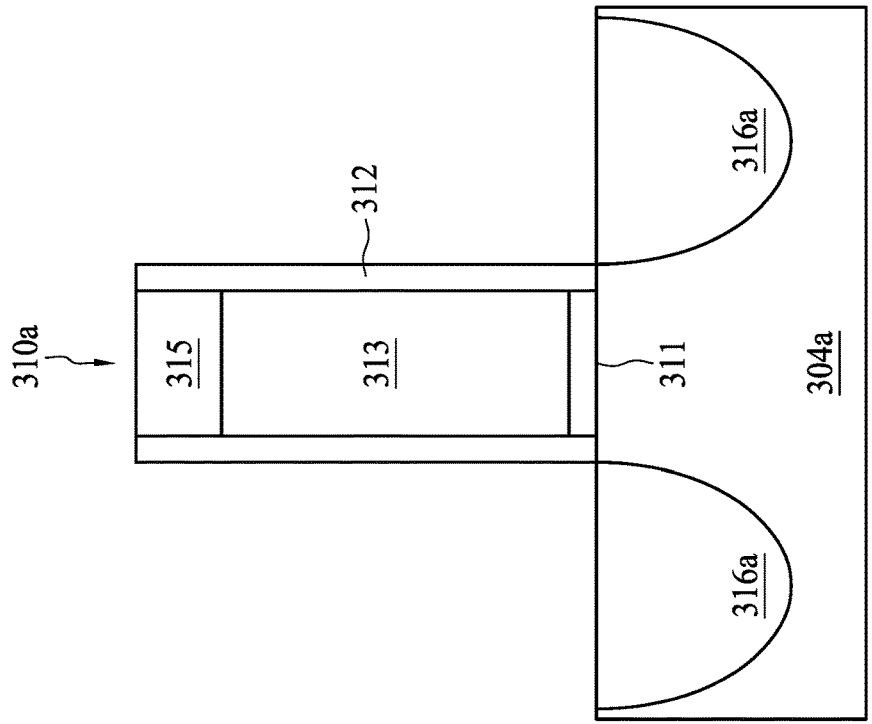
FIGS. 7A to 7L are schematic drawings illustrating a semiconductor device at various fabrication stages constructed according to aspects of the present disclosure in one or more embodiments.
Figure 7A:
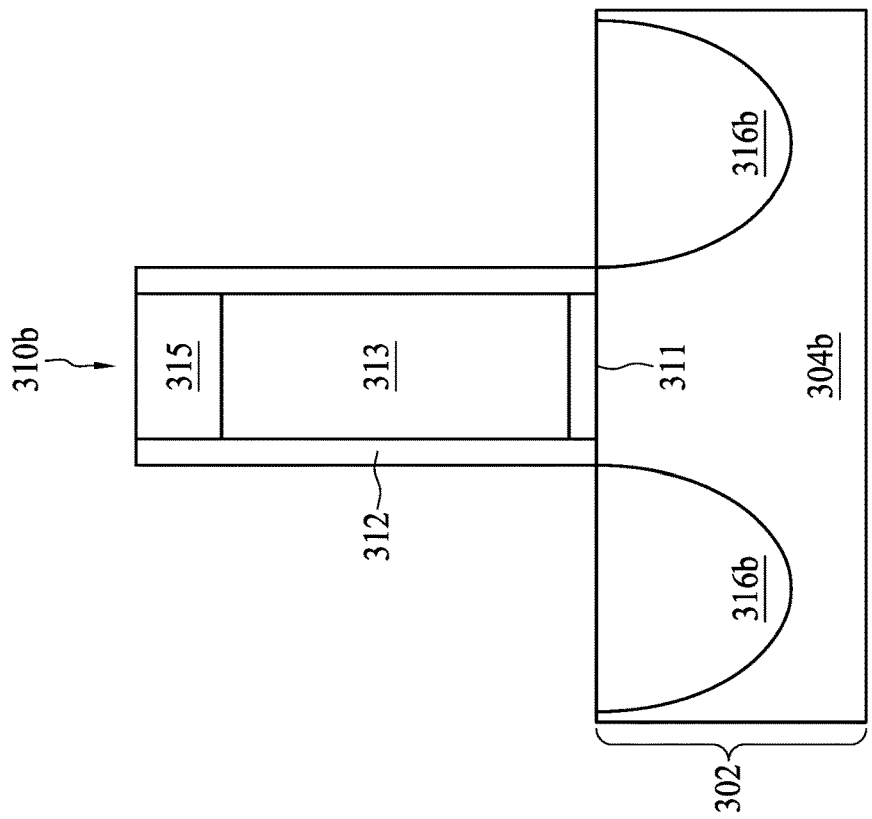

FIGS. 7A to 7L are schematic drawings illustrating a CMOS device 300 at various fabrication stages constructed according to aspects of the present disclosure in one or more embodiments. Further, similar elements in FIGS. 7A to 7L and FIGS. 4A to 4K can include similar materials; therefore, such redundant details are omitted in the interest of brevity. As shown in FIG. 7A, a substrate 302 is received or provided. The substrate 302 can include various doped regions such as n-wells, p-wells and isolation structures to provide electrical isolation between the various doped regions, though such regions and structure are not shown. As mentioned above, the substrate 302 shown in FIG. 7A can include portions of fin structures. Further, the substrate 302 can have a first region 304a and a second region 304b defined thereon. In some embodiments, the first region 304a is defined to accommodate a pFET device, and the second region 304b is defined to accommodate an nFET device, but the disclosure is not limited thereto.

Still referring to FIG. 7A, the substrate 302 includes two similar gates, a first gate 310a and a second gate 310b, respectively disposed in the first region 304a and the second region 304b, according to operation 100 of the method 10 or operation 120 of the methods 12 and 13. In some embodiments, the first gate 310a and the second gate 310b respectively include an interfacial layer. In some embodiments, a high-k dielectric layer can be disposed over the SiO interfacial layer. The interfacial layer and the high-k dielectric layer are generally designated by the reference number 311. The first gate 210a and the second gate 210b further include a polysilicon layer 313 formed over the interfacial layer or the high-k dielectric layer 211. A hard mask 315 is formed over the polysilicon layer 313. It should be understood that the formation of such layers, including patterning is well known in the art, and will not be further discussed in the interest of brevity. Notably, in some embodiments, the first gate 310a and the second gate 310b are referred to as dummy gates.

Still referring to FIG. 7A, a first spacer 312 is formed over sidewalls of the first gate 310a and the second gate 310b. In some embodiments, a thickness of each of the first spacers 312 may be between approximately 3 nm and 6 nm, but the disclosure is not limited thereto. As shown in FIG. 7A, the first spacer 312 is disposed adjacent to both major vertical sidewalls of the first gate 310a and the second gate 310b. In some embodiments, the nitrogen concentration in the first spacer 312 is less than 20%, such that the first spacer 312 serves as a nitride-light spacer, but the disclosure is not limited thereto.

Still referring to FIG. 7A, in some embodiments, a first strained material 316a is formed at two sides of the first gate 310a, and a second strained material 316b is formed at two sides of the second gate 310b. Further, a distance between the first strained material 316a and the sidewall of the polysilicon layer 313 of the first gate 310a is defined by the thickness of the first spacer 312. Similarly, a distance between the second strained material 316b and the sidewall of the polysilicon layer 313 of the second gate 310b is defined by the thickness of the first spacer 312. In some embodiments, spaces for accommodating the first strained material 316a and the second strained material 316b are increased because there are fewer spacers formed over the sidewalls of the gates 310a and 310b. Further, the distance between the strained materials and the channel regions, which are to be formed under the gates 310a and 310b, is reduced. Additionally, a top surface of the first strained material 316a may be higher than a top surface of the substrate 302 due to the greater lattice constant of Ge, though such comparative height are not shown.

Figure 7B:
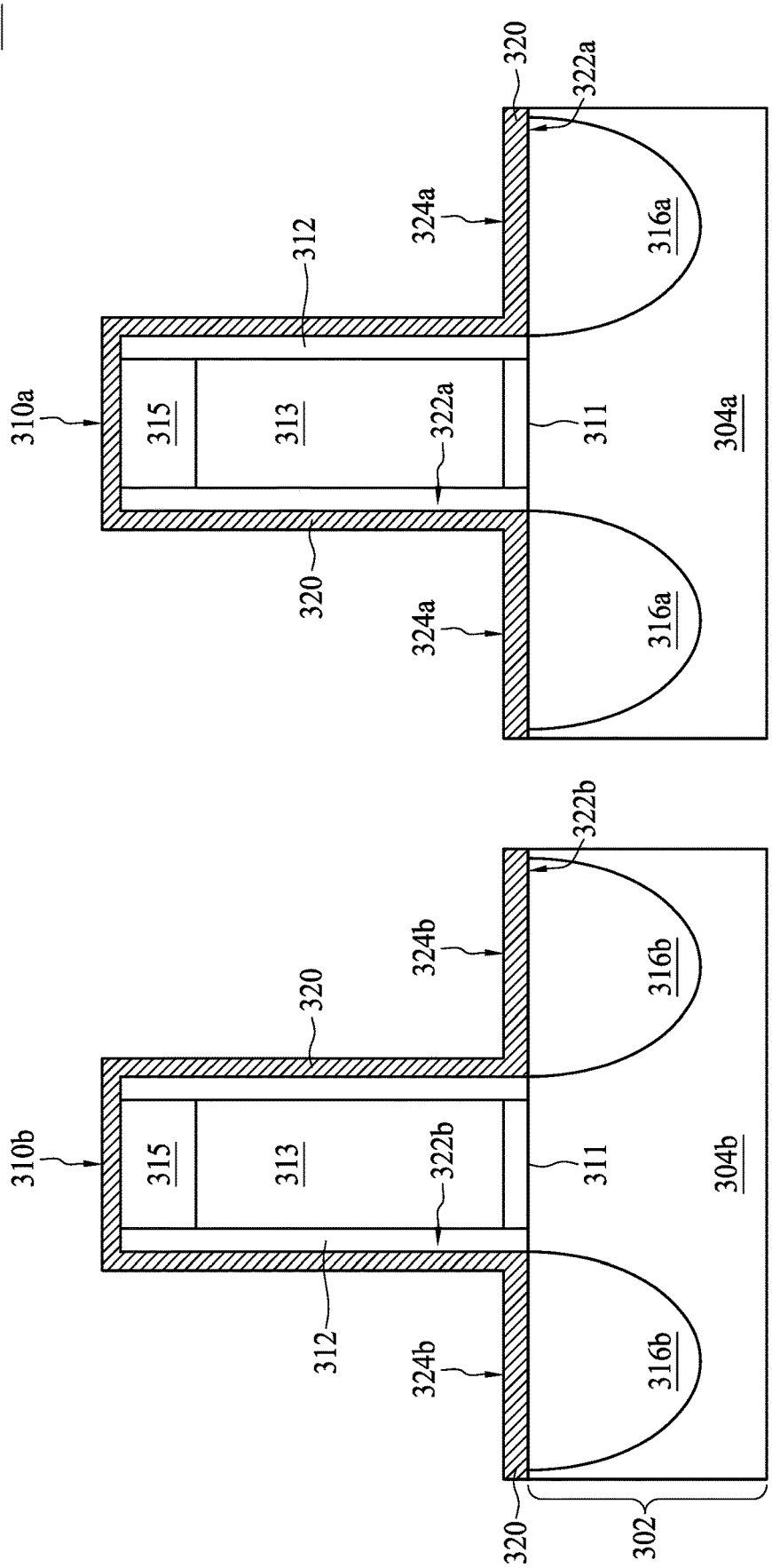

Referring to FIG. 7B, an insulating layer 320 is next formed over the first gate 310a, the second gate 310b and the substrate 302, according to operation 102 of the method 10, or operation 122 of the methods 12 and 13. As shown in FIG. 7B, the insulating layer 320 is formed to cover the top surface of the substrate 302, the sidewalls and a top surface of the first gate 310a, and the sidewalls and a top surface of the second gate 310b. In the first region 304a, the insulating layer 320 has a first side 322a facing the first gate 310a, the substrate 302 or the first strained material 316a, and a second side 324a opposite to the first side 322a. In the second region 304b, the insulating layer 320 has a third side 322b facing the second gate 310b, the substrate 302 or the second strained material 316b, and a fourth side 324b opposite to the third side 322b. In some embodiments, a thickness of the insulating layer 320 is between approximately 2 nm and approximately 5 nm, but the disclosure is not limited thereto. In some embodiments, the insulating layer 320 is a single layer including SiN-based material, as shown in FIG. 7B.

In some embodiments, the insulating layer 320 is a multi-layer structure. For example, in some embodiments, the insulating layer 320 is a bi-layer structure, as shown in FIG. 5, and such details are omitted in the interest of brevity. In some embodiments, the insulating layer 320 is a tri-layer structure, as shown in FIG. 6, and such details are omitted in the interest of brevity.

Figure 7C:
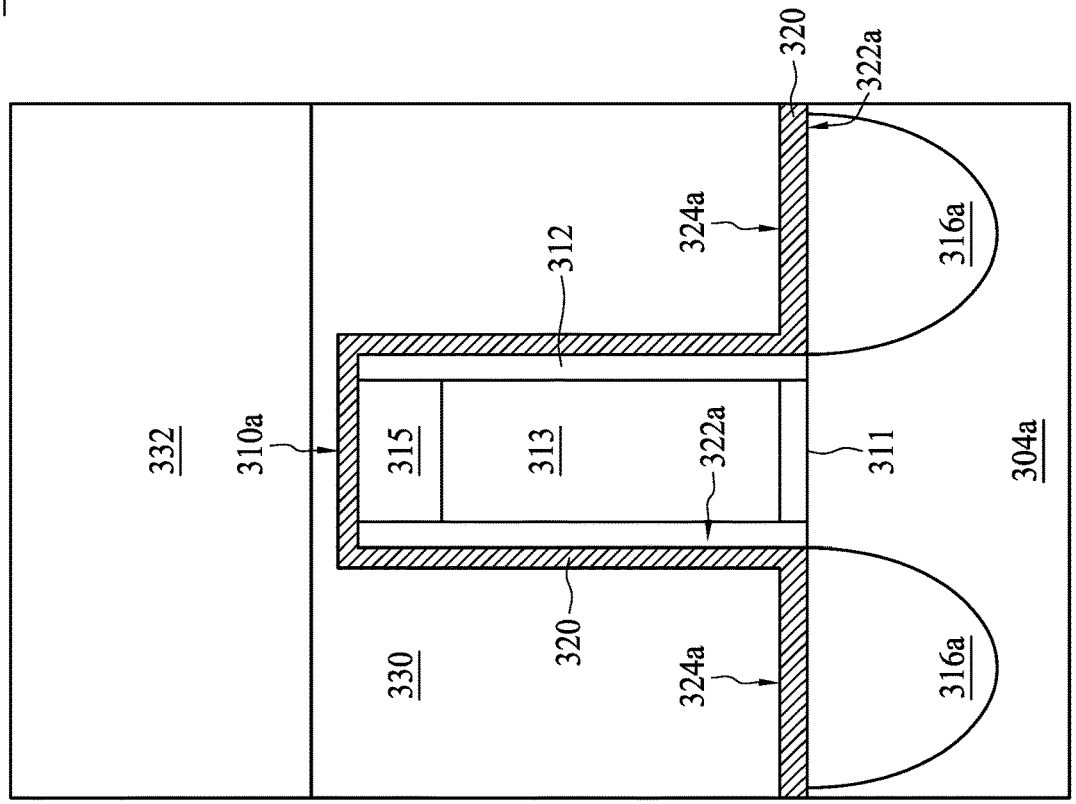
Figure 7C:
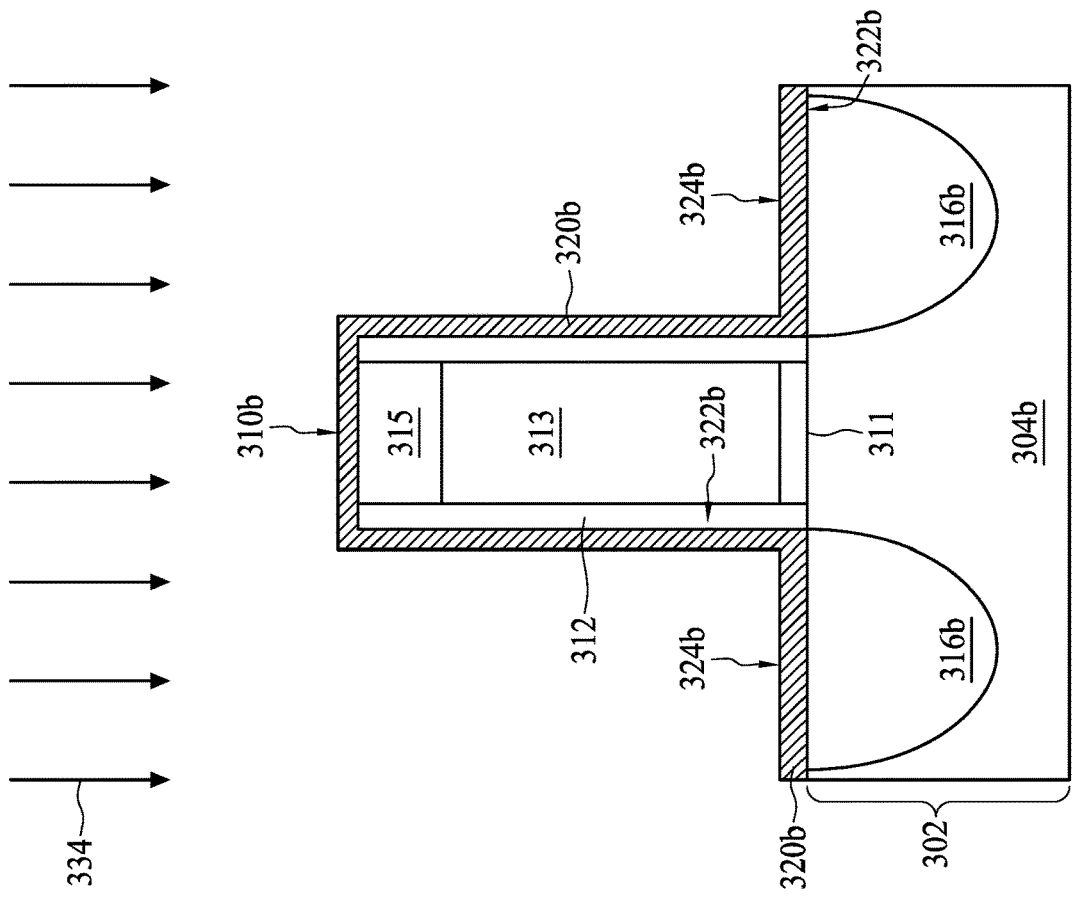

Referring to FIG. 7C, next, a protective layer including a bottom layer 330 and a photoresist 332 is formed over the substrate 302 and patterned. Accordingly, the patterned protective layer 330 and 332 covers and protects the elements in the first region 304a while the elements in the second region 304b are exposed. Subsequently, an ion implantation 334 is performed to implant dopants into the substrate 302 in the second region 304b at the two sides of the second gate 310b. Notably, the insulating layer 320 serves as a screening layer to mitigate damage to the substrate 302 during the ion implantation 334. Further, the dopants are implanted into the substrate 302 by penetrating the insulating layer 320, so that a portion of the insulating layer 320 receives the dopants during the ion implantation 334. In some embodiments, the dopants used in the ion implantation 334 include P, Ar, In or Sb, but the disclosure is not limited thereto. As mentioned above, the thickness of the insulating layer 320 should not be less than 2 nm, because at a thickness less than 2 nm, the insulating layer 320 would not be thick enough to protect the surface of the substrate 302 during the ion implantation 334. After the ion implantation 334, the portion of the insulating layer 320 having the dopants is referred to as a second insulating layer 320a. Next, the patterned protective layer 330 and 332 is removed.

Figure 7D:
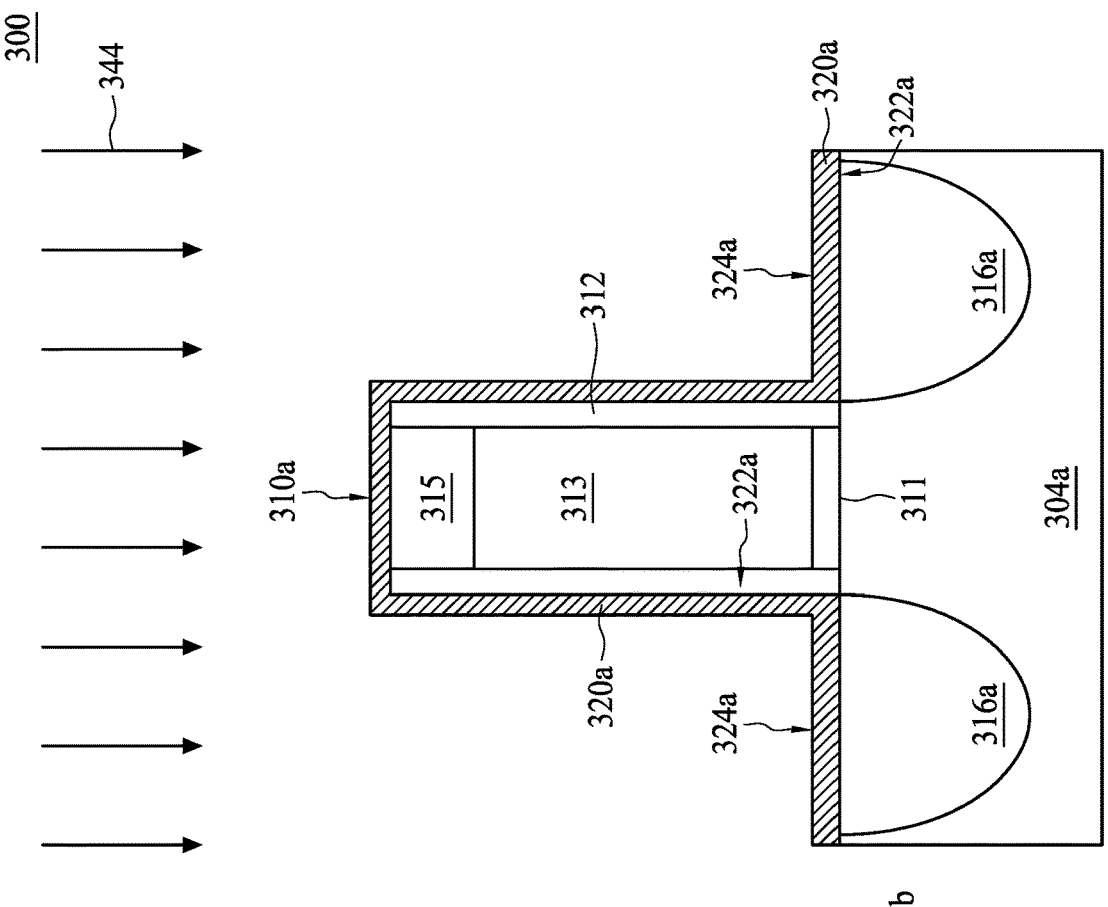
Figure 7D:
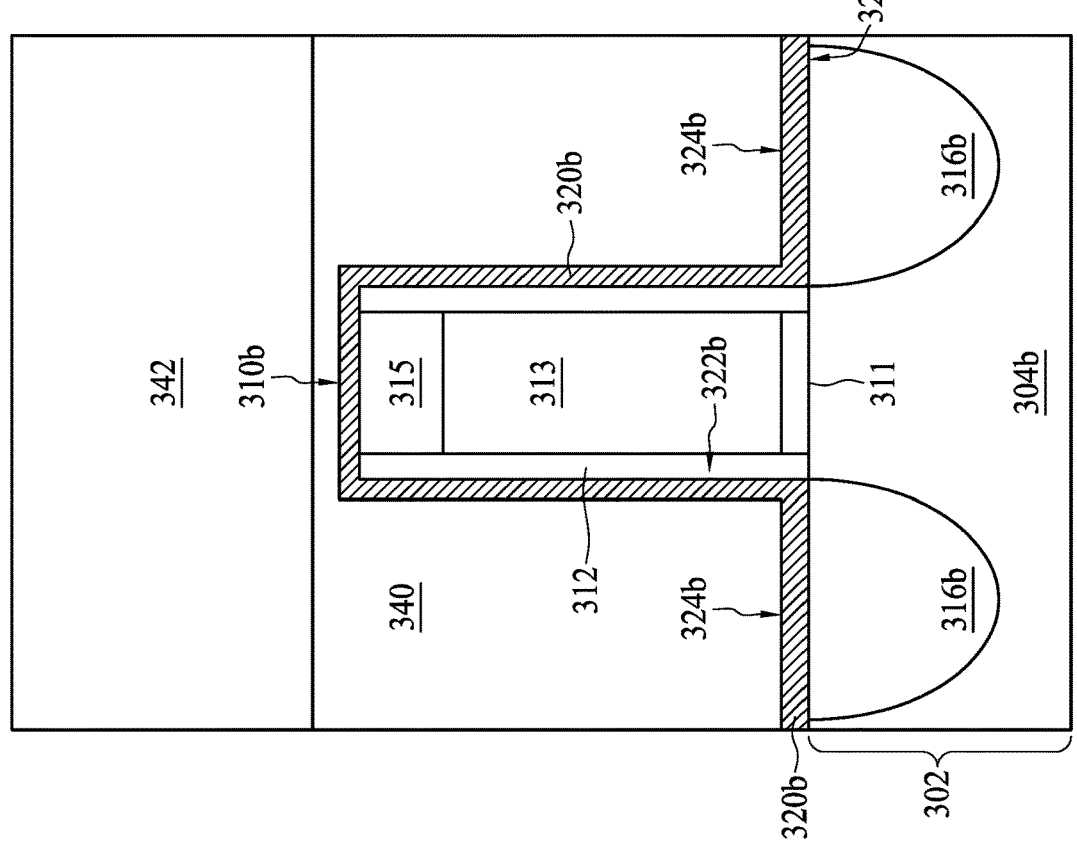

Referring to FIG. 7D, next, another protective layer including a bottom layer 340 and a photoresist 342 is formed over the substrate 302 and patterned. Accordingly, the patterned protective layer 340 and 342 covers and protects the elements in the second region 304b while the elements in the first region 304a are exposed. Subsequently, an ion implantation 344 is performed to implant dopants into the substrate 302 in the first region 304a at the two sides of the first gate 310a. Notably, the insulating layer 320 serves as a screening layer to mitigate damage to the substrate 302 during the ion implantation 334. Further, the dopants are implanted into the substrate 302 by penetrating the insulating layer 320, so that a portion of the insulating layer 320 receives the dopants during the ion implantation 344. In some embodiments, the dopants used in the ion implantation 344 include B, Ga or Yb, but the disclosure is not limited thereto. It should be noted that the thickness of the insulating layer 320 should not be less than 2 nm, because at a thickness less than 2 nm, the insulating layer would not be thick enough to protect the surface of the substrate 302 during the ion implantation 344. After the ion implantation 344, the portion of the insulating layer 320 having the dopants is referred to as a first insulating layer 320b. Next, the patterned protective layer 340 and 342 is removed.

Figure 7E:
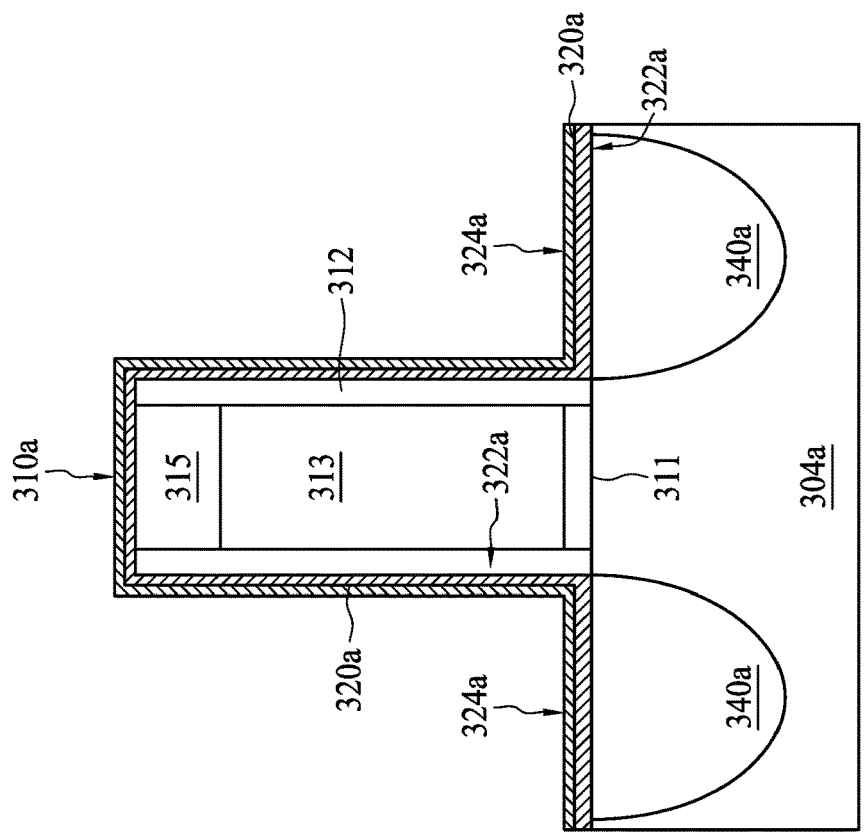

Referring to FIG. 7E, a source/drain is formed in the substrate at two sides of the gate according to operation 104 of the method 10. In some embodiments, an anneal operation is performed to activate the dopants in the first strained material 316a and the dopants in the second strained material 316b, and thus a first source/drain 340a is formed in the substrate 302 at the two sides of the first gate 310a, and a second source/drain 340b is formed in the substrate 302 at the two sides of the second gate 310b, according to operation 124 of the methods 12 and 13. Notably, the first insulating layer 320a and the second insulating layer 320b now serve as the screening layer that reduces dopant outgassing. In some embodiments, a concentration of the dopants in the first insulating layer 320a is reduced from the second side 324a to the first side 322a of the first insulating layer 320a, and a concentration of the dopants in the second insulating layer 320b is reduced from the fourth side 324b to the third side 322b of the second insulating layer 320b. For example, the concentration of boron in the first insulating layer 320a is reduced from approximately 3E10 to approximately 1E21, but the disclosure is not limited thereto. For example, the concentration of phosphorous in the second insulating layer 320b is reduced from approximately 3E10 to approximately 1E21, but the disclosure is not limited thereto.

Figure 7F:
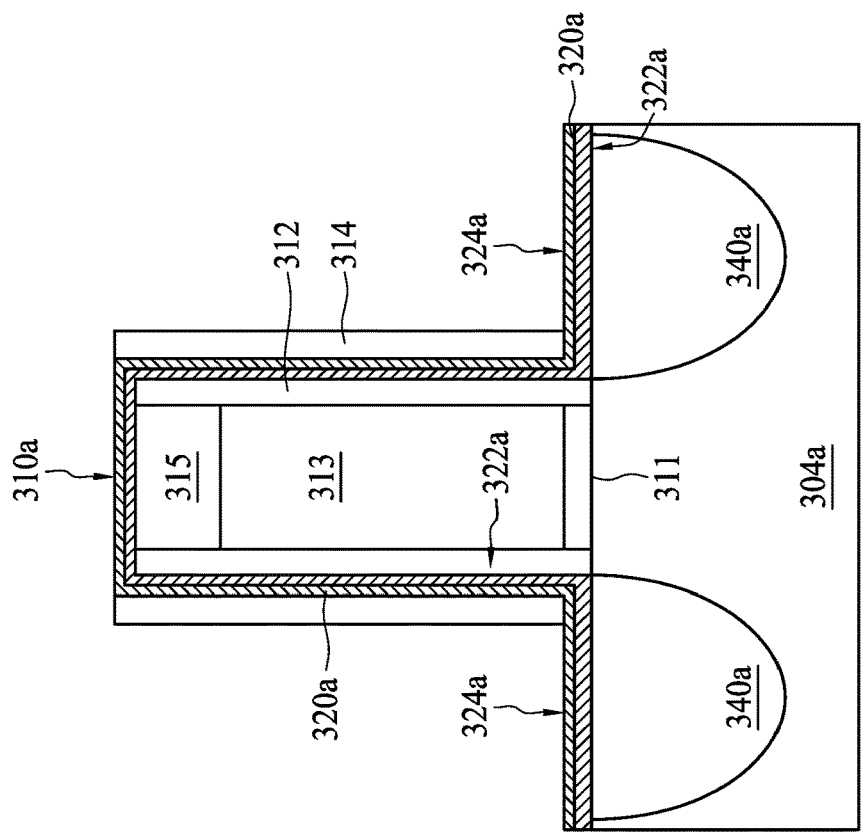

Referring to FIG. 7F, a second spacer 314 is formed over the major vertical sidewalls of the first gate 310a and the major vertical sidewalls of the second gate 310b. In some embodiments, the second spacer 314 can include SiN, SiO, SiON, SiCN, SiOCN, and/or other suitable dielectric material. In some embodiments, the nitrogen concentration in the second spacer 314 is less than 20%, such that the second spacer 314 serves as a nitride-light spacer, but the disclosure is not limited thereto. Additionally, the first spacer 312 and the second spacer 314 can include different materials in some embodiments, and may be the same in other embodiments.

Figure 7G:
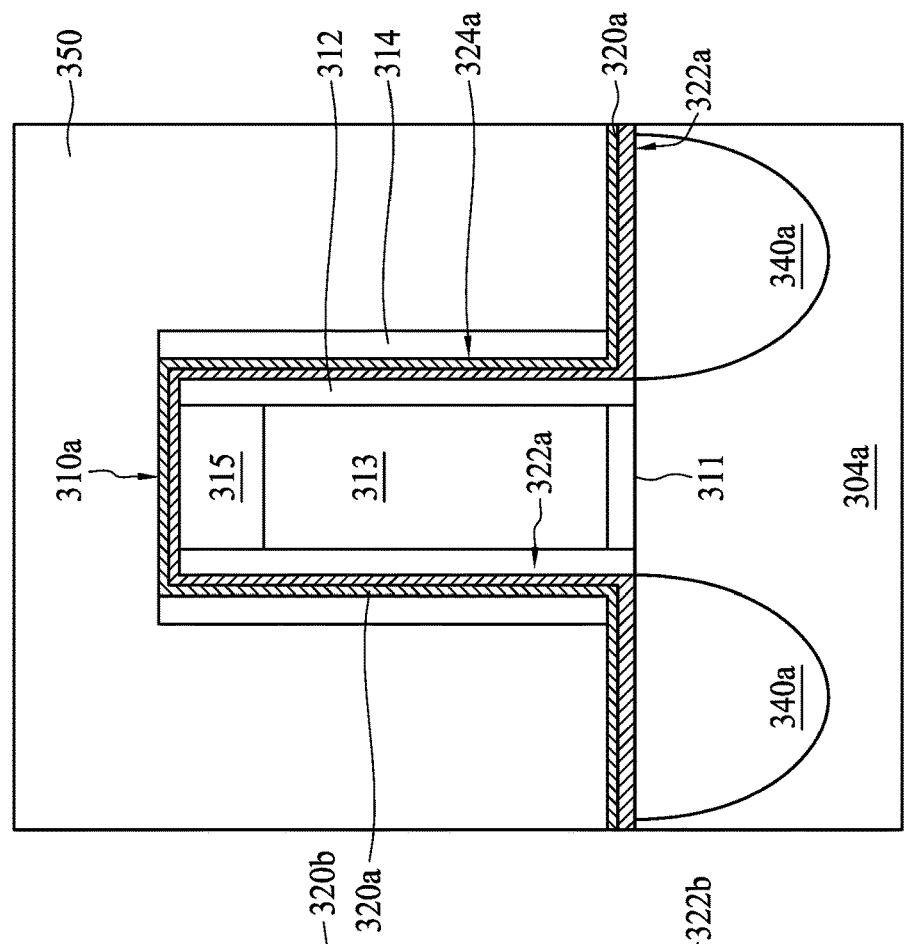
Figure 7G:
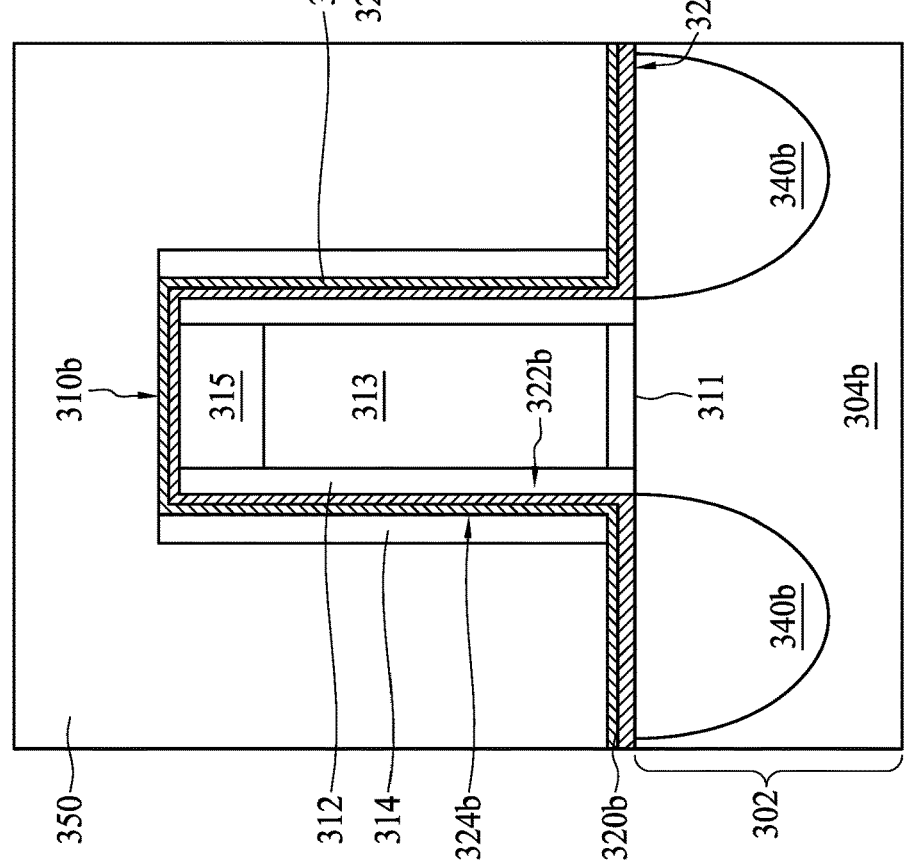

Referring to FIG. 7G, an ILD layer 350 is then formed on the insulating layer 320a and 320b according to operation 106 of the method 10 or operation 126 of the method 12 and 13. In some embodiments, the ILD layer 350 covers the substrate 302, and the first gate 310a and the second gate 310b are embedded within the ILD layer 350. It should be noted that the thickness of the insulating layer 320 (including the first insulating layer 320a and the second insulating layer 320b) should not be greater than 5 nm, because at a thickness greater than 5 nm, the insulating layer 320 is too thick to allow the ILD layer 250 to easily fill the space between the first and second gates 310a and 310b. In some embodiments, an unwanted void or seam may be formed in the ILD layer 350 if the thickness of the insulating layer 320 is greater than 5 nm, and such void or seam may degrade the electrical isolation provided by the ILD layer 350.

Figure 7H:
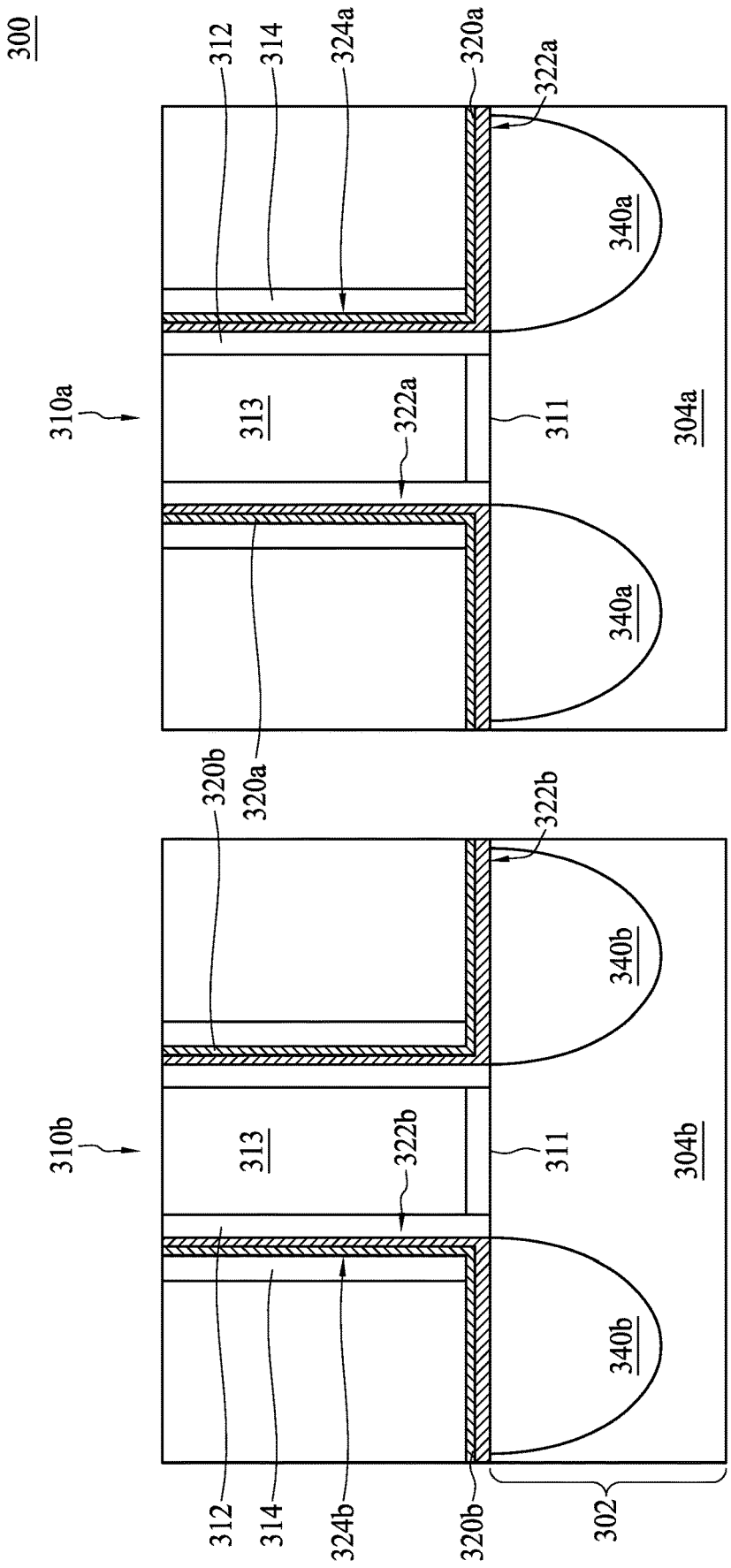

Referring to FIG. 7H, a portion of the ILD layer 350 and a portion of the insulating layer 320 are removed according to operation 128 of the method 13. In some embodiments, in addition to the removal of the portion of the ILD layer 350 and the removal of the portion of the insulating layer 320, the hard mask 315, a portion of the first spacer 312 and a portion of the second spacer 314 are also removed. Consequently, the polysilicon layers 313 of the first gate 310a and the second gate 310b are exposed, as shown in FIG. 7H.

Figure 7I:
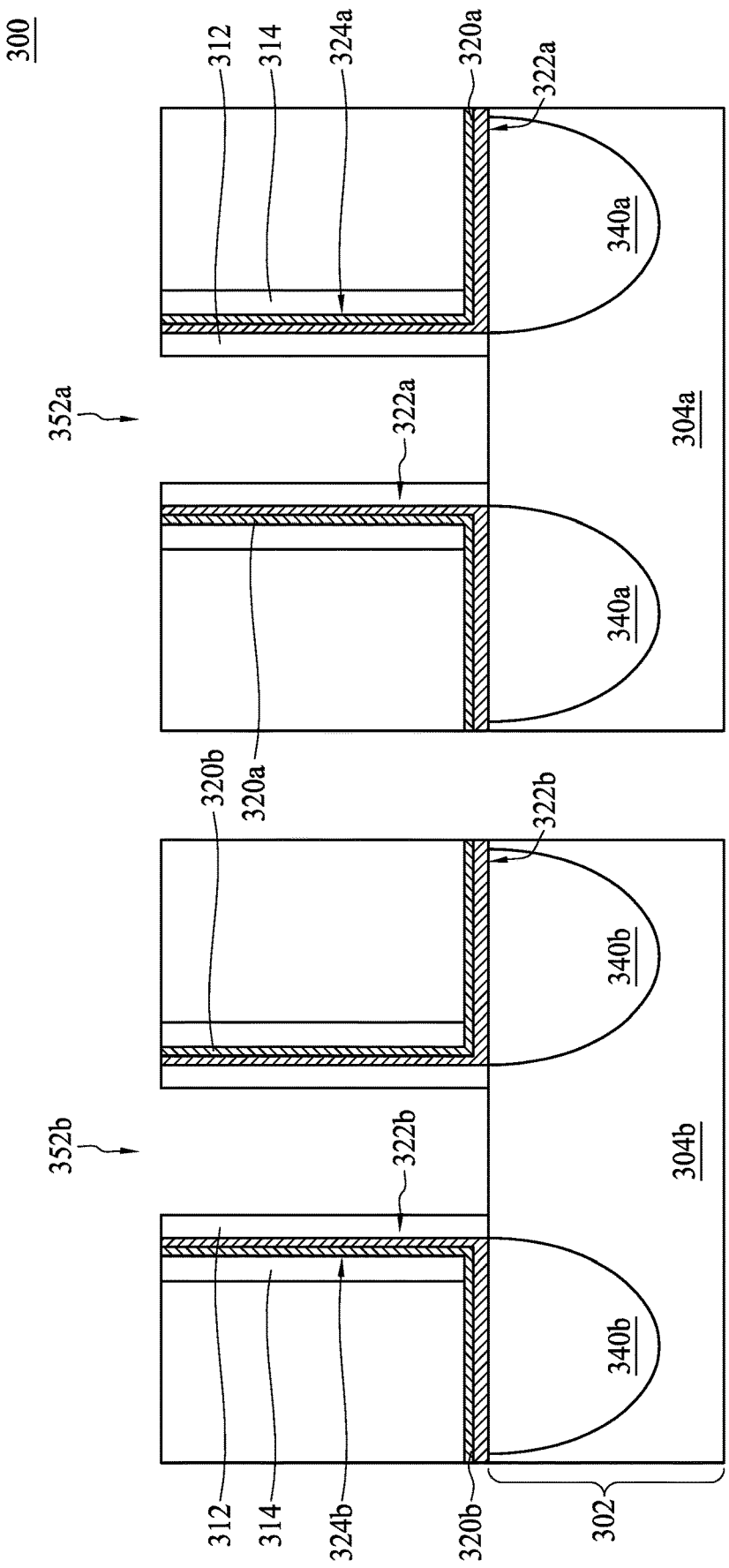

Referring to FIG. 7I, the polysilicon layer 313 and the interfacial layer and the high-k dielectric layer 311 are removed, and thus a first gate trench 352a is formed in the ILD layer 350 in the first region 304a and a second gate trench 352b is formed in the ILD layer 350 in the second region 304b, according to operation 130 of the method 13. In some embodiments, the first gate trench 350a and the second gate trench 350b are simultaneously formed, as shown in FIG. 7I. In other embodiments, the second gate trench 350b can be formed after the forming of the metal gate in the first gate trench 352a, which will be discussed below.

Figure 7J:
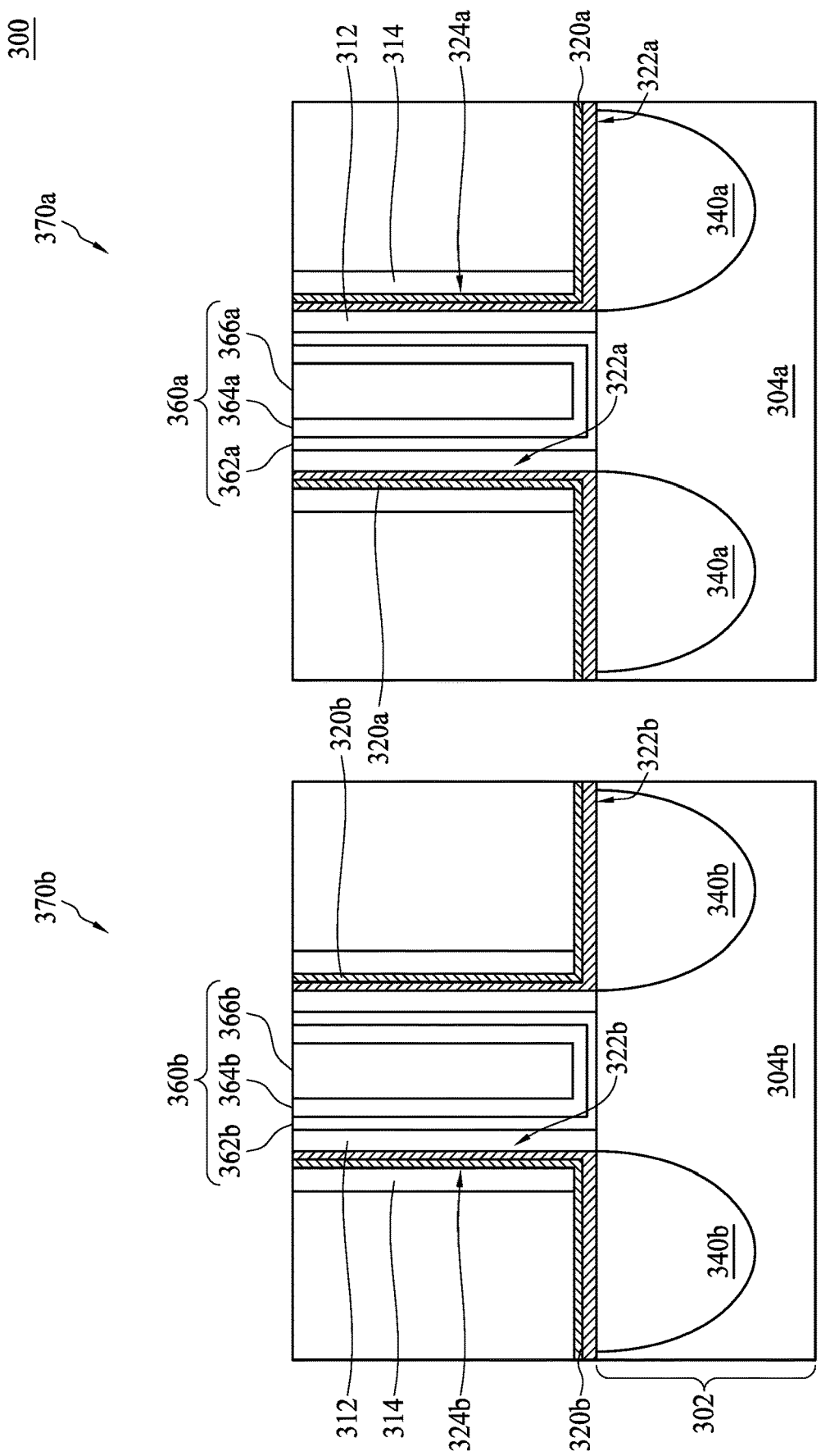

Referring to FIG. 7J, a first metal gate 360a is formed in the first gate trench 352a and a second metal gate 360b is formed in the second gate trench 352b, according to operation 132 of the method 13. In some embodiments, the first metal gate 360a includes at least a high-k dielectric layer 362a, a first work function metal layer 364a, and a gap-filling metal layer 366a, and the second metal gate 360b includes at least a high-k dielectric layer 362b, a second work function metal layer 364b, and a gap-filling metal layer 366b. In some embodiments, barrier layers or etch stop layers can be formed if required. In some embodiments, an interfacial layer (not shown) can be formed between the high-k dielectric layer 362a/362b and the substrate 302. In some embodiments, the first work function metal layer 364a can include one or more layers of conductive material for the pFET device, and the second work function metal layer 364b can include one or more layers of conductive material for the nFET device. The second work function metal layer 364b is made of a different material than the first work function metal layer 364a. The gap-filling metal layers 366a and 366b can include one or more layers of conductive material that have lower resistance and better gap-filling ability. In some embodiments, a planarization operation can be performed after the forming of the gap-filling metal layer 366*a* and 366*b*, and thus superfluous metal layers are removed and a substantially even surface is obtained as shown in FIG. 7J.

Figure 7K:
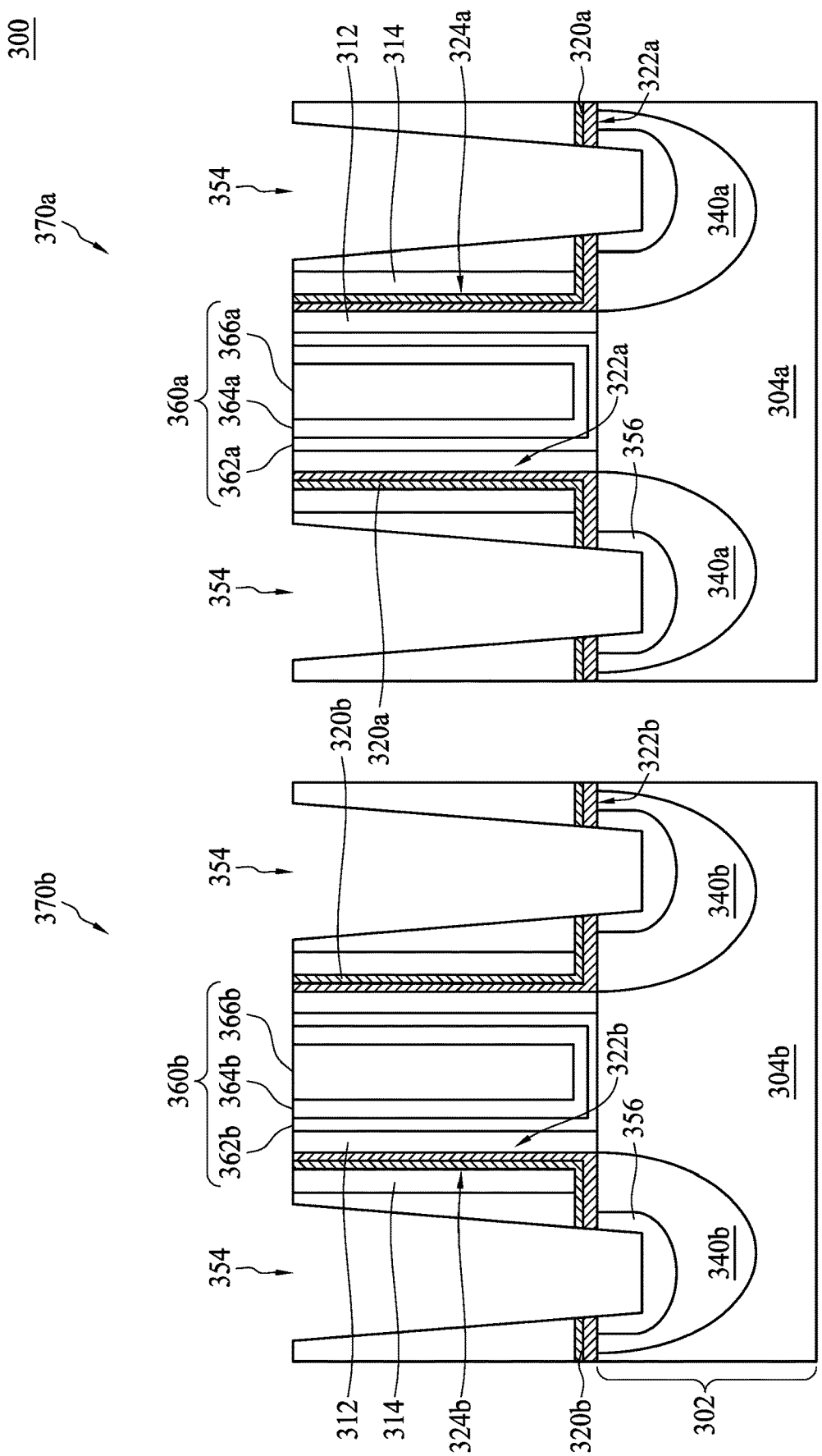

Referring to FIG. 7K, a plurality of openings 354 are formed in the ILD layer 350 according to operation 134 of the method 13. In some embodiments, the openings 354 penetrate the ILD layer 350, the first insulating layer 320*a* and the second insulating layer 320*b*. Accordingly, the first source/drain 340*a* and the second source/drain 340*b* are exposed through the openings 354, as shown in FIG. 7K. In some embodiments, the openings 354 are formed by etching the ILD layer 350. Further, the etching is stopped at the first insulating layer 320*a* and the second insulating layer 320*b*. Thus, the first insulating layer 320*a* and the second insulating layer 320*b* serve as a CESL. Next, portions of the first insulating layer 320*a* and the second insulating layer 320*b* are removed and thus the first source/drain 340*a* and the second source/drain 340*b* are exposed. In some embodiments, a portion of the first source/drain 340*a* and a portion of the second source/drain 340*b* are removed, and thus a bottom of the openings 354 can be formed to be lower than a top surface of the first source/drain 340*a* and a top surface of the second source/drain 340*b*, but the disclosure is not limited thereto.

Figure 7L:
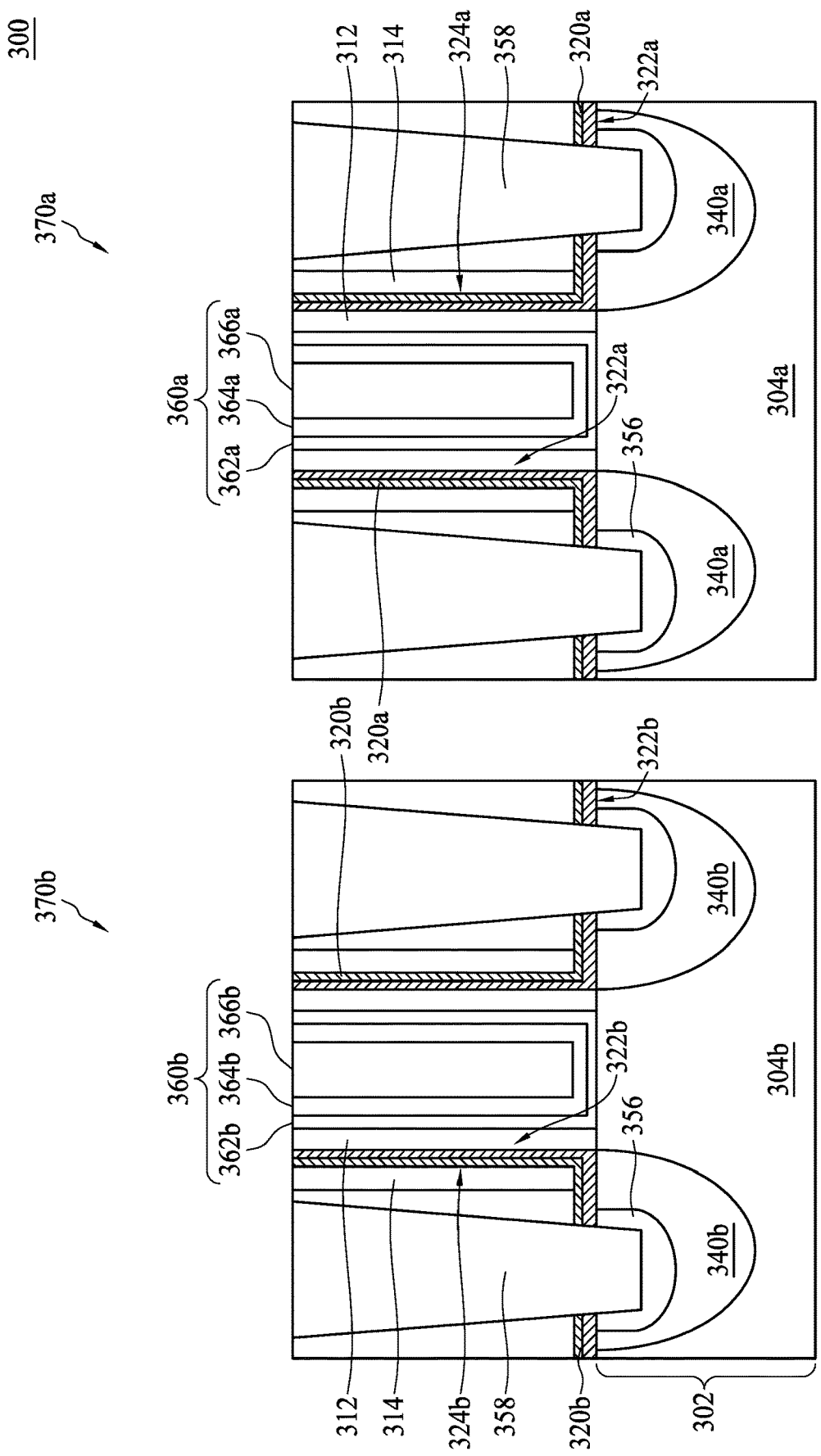

Referring to FIG. 7L, a connecting structure 358 is formed in each of the openings 354 according to operation 136 of the method 13. In some embodiments, metal silicide layers 356 can be formed before the forming of the connecting structures 358 for reducing contact resistance.

Accordingly, a CMOS device 300 is obtained. The CMOS device 300 can include a first FET device 370*a* such as a pFET device and a second FET device 370*b* such as an nFET device. In some embodiments, the CMOS device 300 is similar as the CMOS device 200, therefore only the differences are described. As shown in FIG. 7L, the first insulating layer 320*a* and the second insulating layer 320*b* of the CMOS device 300 are disposed between the first spacer 312 and the second spacer 314. Further, the first strained material 316*a* of the first source/drain 340*a* and the second strained material 316*b* of the second source/drain 340*b* are larger than the first strained material 216*a* of the first source/drain 240*a* and the second strained material 216*b* of the second source/drain 240*b* because the second spacer 314 is formed after the forming of the first and second strained materials 316*a* and 316*b*.

According to the semiconductor device 370*a* or 370*b*, and the CMOS device 300 including the devices 370*a* and 370*b*, the first insulating layer 320*a* and the second insulating layer 320*b* serve as the screening layer during the forming of the first and second source/drain 340*a* and 340*b*, and further serve as the CESL during the forming of the connecting structure 358. As a screening layer, the first insulating layer 320*a* and the second insulating layer 320*b* provide better protection for the substrate during the ion implantations 334 and 344, and the first insulating layer 320*a* and the second insulating layer 320*b* provide a better seal to reduce dopant outgassing during the anneal. As a CESL, the first insulating layer 320*a* and the second insulating layer 320*b* serve as the stop layer during the forming of the openings 354. Further, since the first insulating layer 320*a* and the second insulating layer 320*b* serve as both the screening layer and the CESL, there is no longer a need to remove the screening layer after the forming of the source/drains and no need to form the CESL after the removal of the screening layer. Consequently, damage to the substrate 302 due to the removal of the screening layer is prevented, and operations for forming the semiconductor device 370*a* or 370*b* or the CMOS device 300 are thereby simplified.

The present disclosure provides a semiconductor device having an insulating layer formed of SiN-based layer. Further, the SiN-based insulating layer serves as a screening layer and a CESL. The SiN-based insulating layer, as the screening layer, provides better sealing ability and thus damage to the substrate during the ion implantation and dopant outgassing during thermal anneal are both reduced. Further, since the SiN-based insulating layer serves as CESL, removal of the screening layer is no longer necessary, and thus damage to the substrate due to the removal of the screening layer is prevented and performance of the semiconductor device is improved.

In some embodiments, a semiconductor device is provided. The semiconductor device includes a substrate, a gate disposed over the substrate, a source/drain disposed in the substrate at two sides of the gate, and an insulating layer disposed over sidewalls of the gate and at least a portion of a surface of the source/drain. In some embodiments, the insulating layer includes a first side facing the gate or the source, and includes a second side opposite to the first side. In some embodiments, the insulating layer includes dopants, and a concentration of the dopants is reduced from the second side to the first side of the insulating layer.

In some embodiments, a complementary metal-oxide-semiconductor (CMOS) device is provided. The CMOS device includes a first gate and a second gate, a first source/drain disposed in the substrate at two sides of the first gate and a second source/drain disposed in the substrate at two sides of the second gate, a first insulating layer disposed over sidewalls of the first gate and at least a portion of a surface of the first source/drain, and a second insulating layer disposed over sidewalls of the second gate and at least a portion of a surface of the second source/drain. In some embodiments, the first source/drain and the first insulating layer include first dopants, and the second source/drain and the second insulating layer include second dopants, and conductivity types of the first dopants and the second dopants are complementary to each other.

In some embodiments, a method for forming a semiconductor device is provided. The method includes the following operations. A substrate having a gate formed thereon is received. An insulating layer is formed over the substrate and sidewalls and a top of the gate. In some embodiments, the insulating layer has a first side facing the gate or the substrate, and a second side opposite to the first side. A source/drain is formed in the substrate at two sides of the gate. An ILD layer is formed over the substrate. In some embodiments, the source/drain and the insulating layer include the same dopants, and a concentration of the dopants in the insulating layer is reduced from the second side to the first side of the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a gate over the substrate;
a source/drain in the substrate at two sides of the gate;
a metal silicide layer in the source/drain;
an insulating layer over sidewalls of the gate and at least a portion of a surface of the source/drain, wherein the insulating layer has a first side facing the gate or the source/drain, and a second side opposite to the first side;
a first spacer disposed between the insulating layer and the gate; and
a second spacer disposed between the insulating layer and the first spacer,
wherein the second spacer is in contact with the source/drain, the insulating layer covers a portion of the metal silicide layer, the insulating layer and the source/drain comprise same dopants, and a concentration of the dopants in the insulating layer is reduced from the second side to the first side of the insulating layer.

2. The semiconductor device of claim 1, wherein the insulating layer comprises silicon nitride (Si3N4), silicon carbo-nitride (SiCN), silicon oxynitride (SiON), or silicon oxycarbonitride (SiOCN).

3. The semiconductor device of claim 1, wherein the concentration of the dopants in the insulating layer is reduced from approximately 3E10 dopants/cm$^3$ to approximately 1E21 dopants/cm$^3$.

4. The semiconductor device of claim 1, wherein a thickness of the insulating layer is between approximately 2 nanometers (nm) and approximately 4 nm.

5. The semiconductor device of claim 1, wherein the insulating layer comprises a multi-layer structure.

6. The semiconductor device of claim 1, wherein the dopants comprise boron (B), gallium (Ga) or ytterbium (Yb).

7. The semiconductor device of claim 1, wherein the dopants comprise phosphorous (P), arsenic (Ar), indium (In) or antimony (Sb).

8. A complementary metal-oxide-semiconductor (CMOS) device, comprising:
a first gate and a second gate over a substrate;
a first source/drain in the substrate at two sides of the first gate and a second source/drain in the substrate at two sides of the second gate;
a metal silicide layer in the first source/drain and the second source/drain, respectively;
a first insulating layer over sidewalls of the first gate and at least a portion of a surface of the first source/drain;
a second insulating layer over sidewalls of the second gate and at least a portion of a surface of the second source/drain;
a first connecting structure disposed over the first source/drain; and
a second connecting structure disposed over the second source/drain,
wherein the first insulating layer and the second insulating layer respectively cover a portion of the metal silicide layer, the first source/drain and the first insulating layer comprise first dopants, the second source/drain and the second insulating layer comprise second dopants, conductivity types of the first dopants and the second dopants are complementary to each other, a bottom surface of the first connecting structure is lower than a surface of the substrate, and a bottom surface of the second connecting structure is lower than the surface of the substrate.

9. The CMOS device of claim 8, wherein the first insulating layer comprises a first side facing the first gate or the first source/drain and a second side opposite to the first side, and a first concentration of the first dopants is reduced from the second side to the first side of the first insulating layer.

10. The CMOS device of claim 8, wherein the second insulating layer comprises a third side facing the second gate or the second source/drain and a fourth side opposite to the third side, and a second concentration of the second dopants is reduced from the fourth side to the third side of the second insulating layer.

11. The CMOS device of claim 8, wherein the first insulating layer has a compressive stress.

12. The CMOS device of claim 8, wherein the second insulating layer has a tensile stress.

13. The CMOS device of claim 8, further comprising a first spacer disposed between the first gate and the first insulting layer and a second spacer disposed between the second gate and the second insulating layer.

14. The CMOS device of claim 13, further comprising a third spacer disposed between the first spacer and the first insulting layer and a fourth spacer disposed between the second spacer and the second insulating layer.

15. The CMOS device of claim 13, further comprising:
a third spacer, wherein the first insulating layer is disposed between the first spacer and the third spacer; and
a fourth spacer, wherein the second insulating layer is disposed between the second spacer and the fourth spacer.

* * * * *